United States Patent
Uchida

(10) Patent No.: US 9,887,108 B2
(45) Date of Patent: Feb. 6, 2018

(54) GAS SUPPLY DEVICE AND SUBSTRATE PROCESSING APPARATUS

(71) Applicant: Tokyo Electron Limited, Tokyo (JP)

(72) Inventor: Yohei Uchida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 166 days.

(21) Appl. No.: 14/391,482

(22) PCT Filed: May 9, 2013

(86) PCT No.: PCT/JP2013/063616
§ 371 (c)(1),
(2) Date: Oct. 9, 2014

(87) PCT Pub. No.: WO2013/168825
PCT Pub. Date: Nov. 14, 2013

(65) Prior Publication Data
US 2015/0107772 A1    Apr. 23, 2015

Related U.S. Application Data

(60) Provisional application No. 61/648,701, filed on May 18, 2012.

(30) Foreign Application Priority Data

May 11, 2012 (JP) ................. 2012-109798

(51) Int. Cl.
*H01L 21/67* (2006.01)
*H01J 37/32* (2006.01)
*C23C 16/455* (2006.01)

(52) U.S. Cl.
CPC .. *H01L 21/67069* (2013.01); *C23C 16/45563* (2013.01); *C23C 16/45565* (2013.01); *H01J 37/3244* (2013.01); *H01J 37/32091* (2013.01)

(58) Field of Classification Search
CPC ........... H01L 21/67069; H01J 37/3244; H01J 37/32091; C23C 16/45563; C23C 16/45565
See application file for complete search history.

(56) References Cited

U.S. PATENT DOCUMENTS

| | | | | |
|---|---|---|---|---|
| 4,537,217 A | * | 8/1985 | Allen, Jr. ............... | B01D 15/14 137/561 A |
| 5,958,140 A | * | 9/1999 | Arami ............... | C23C 16/45502 118/715 |
| 6,333,019 B1 | * | 12/2001 | Coppens ................... | B01F 5/06 23/293 R |

(Continued)

FOREIGN PATENT DOCUMENTS

| CN | 101425450 A | 5/2009 |
|---|---|---|
| JP | 11-158662 A | 6/1999 |

(Continued)

*Primary Examiner* — Jeffrie R Lund
(74) *Attorney, Agent, or Firm* — Pearne & Gordon LLP

(57) ABSTRACT

A shower head 13 (gas supply device) of supplying a processing gas and an additional gas from a processing gas supply source and an additional gas source, respectively, into a processing space S includes multiple gas distribution plates 28 to 31, the cooling plate 32, and the cover plate 33 stacked in sequence. A peripheral gas diffusion space 35 and an outermost gas diffusion space 36 are formed in the undermost gas distribution plate 28. At least one gas supply path for supplying the processing gas and additional gas into any one of the peripheral gas diffusion space and the outermost gas diffusion space is formed at each of the gas distribution plates. The gas supply path is branched into multiple lines and distances from the processing gas supply source to front ends of the respective branch lines are set to be all the same.

5 Claims, 17 Drawing Sheets

(56) References Cited

U.S. PATENT DOCUMENTS

| | | | |
|---|---|---|---|
| 7,040,555 B2* | 5/2006 | Miinalainen | B05C 11/10 239/124 |
| 7,674,394 B2 | 3/2010 | Paterson et al. | |
| RE42,882 E* | 11/2011 | Kearney | B01F 5/06 138/42 |
| 2002/0196706 A1* | 12/2002 | Kearney | A47J 43/0465 366/274 |
| 2004/0134611 A1* | 7/2004 | Kato | C23C 16/455 156/345.33 |
| 2004/0140252 A1* | 7/2004 | Gebauer | B01D 15/14 210/198.2 |
| 2005/0000879 A1* | 1/2005 | Kearney | B01D 15/14 210/287 |
| 2007/0299292 A1* | 12/2007 | Cross | C07C 2/62 585/720 |
| 2008/0081114 A1* | 4/2008 | Johanson | C23C 16/45565 427/273 |
| 2008/0216747 A1* | 9/2008 | Wieder | C23C 16/45565 118/723 R |
| 2009/0117746 A1 | 5/2009 | Masuda | |
| 2009/0133631 A1* | 5/2009 | Wieder | C23C 16/45565 118/723 R |
| 2009/0159213 A1* | 6/2009 | Bera | H01J 37/3244 156/345.34 |
| 2013/0315795 A1* | 11/2013 | Bera | H01J 37/321 422/310 |
| 2014/0193977 A1* | 7/2014 | Kawamata | H01L 21/3065 438/710 |
| 2015/0107772 A1* | 4/2015 | Uchida | H01J 37/32091 156/345.33 |

FOREIGN PATENT DOCUMENTS

| | | |
|---|---|---|
| JP | 2002-252208 A1 | 9/2002 |
| JP | 2008-117477 A | 5/2008 |
| JP | 2009-117477 A | 5/2009 |

* cited by examiner

000# GAS SUPPLY DEVICE AND SUBSTRATE PROCESSING APPARATUS

CROSS-REFERENCE TO RELATED APPLICATION

This Application is a U.S. national phase application under 35 U.S.C. § 371 of PCT Application No. PCT/JP2013/063616 filed on May 9, 2013, which claims the benefit of Japanese Patent Application No. 2012-109798 filed on May 11, 2012, and U.S. Provisional Application Ser. No. 61/648,701 filed on May 18, 2012, the entire disclosures of which are incorporated herein by reference.

TECHNICAL FIELD

The embodiments described herein pertain generally to a gas supply device and a substrate processing apparatus of distributing and supplying a gas to multiple regions formed by dividing a processing space where a substrate is processed.

BACKGROUND

In a substrate processing apparatus, which includes a processing chamber that accommodates a wafer for a semiconductor device (hereinafter, simply referred to as "wafer") serving as a substrate and performs a plasma process on the wafer with plasma generated within the processing chamber, the plasma needs to be uniformly distributed in a processing space facing the wafer within the processing chamber in order to perform a uniform plasma process on the wafer.

Distribution of the plasma depends on distribution of a processing gas in the processing space. Thus, there has been suggested a substrate processing apparatus in which a processing space is divided into multiple regions and flow rates of processing gases to be introduced into the respective regions are controlled (see, for example, Patent Document 1).

In the substrate processing apparatus, there are formed multiple gas diffusion spaces respectively corresponding to multiple regions divided within a shower head facing the processing space. A processing gas supplied into each of the gas diffusion spaces is introduced into each of the regions through multiple gas holes. By controlling a flow rate of the processing gas to be supplied into each of the gas diffusion spaces, a flow rate of the processing gas to be introduced into each of the respective regions can be controlled.

Further, in order to uniformly distribute the processing gas in each of the regions, it is desirable to uniformly distribute the processing gas in each of the gas diffusion spaces. Thus, it has been suggested that multiple gas supply openings for supplying the processing gas into the gas diffusion spaces are arranged in a symmetrical or uniform manner with respect to a center of the gas diffusion space and distances of gas supply paths from a gas supply source to the respective gas supply openings are all the same (see, for example, Patent Document 2).

In Patent Document 2, as depicted in FIG. 24, there is provided a plate-shaped manifold (gas distribution plate) 251 including multiple gas supply openings 250a and 250b which are uniformly arranged to penetrate through the manifold. Further, gas supply grooves 252a and 252b, which are branched, are formed on an upper surface of the manifold 251. In the respective gas supply grooves 252a and 252b, distances from communicating portions 253a and 253b with a gas supply source (not illustrated) to the gas supply openings 250a and 250b, respectively, are set to be all the same.

Thus, the processing gas can be supplied from the gas supply openings 250a at the same timing and at the same pressure. Further, the processing gas can be supplied from the gas supply openings 250b at the same timing and at the same pressure.

REFERENCES

Patent Document 1: Japanese Patent Laid-open Publication No. 2008-117477
Patent Document 2: U.S. Pat. No. 7,674,394

DISCLOSURE OF THE INVENTION

Problems to be Solved by the Invention

However, since a diameter of a wafer will be further increased and a plasma process, for example, a dry etching process, needs to be micro-processed, plasma needs to be distributed more uniformly in a processing space. Therefore, the processing space needs to be divided into more regions by increasing the number of gas diffusion spaces in a shower head. According to Patent Document 2, since multiple gas supply grooves are formed in a single gas distribution plate, the number of gas supply grooves to be formed is limited in consideration of interference between the gas supply grooves. Consequently, the number of gas diffusion spaces respectively corresponding to the gas supply grooves cannot be increased, so that plasma cannot be distributed more uniformly in the processing space.

In view of the foregoing, example embodiments provide a gas supply device and a substrate processing apparatus capable of distributing plasma more uniformly in a processing space.

Means for Solving the Problems

In one example embodiment, a gas supply device of supplying a gas into a processing space from a gas supply source includes a facing plate that faces the processing space and includes multiple through holes; multiple gas distribution plates; and a cover plate. The facing plate, the gas distribution plates, and the cover plate are stacked in sequence. In a surface, which faces the facing plate, of the gas distribution plate closest to the facing plate, multiple gas diffusion spaces are formed. In each of the gas distribution plates, at least one gas supply path through which the gas is supplied into any one of the gas diffusion spaces from the gas supply source is formed, and in each of the gas distribution plates, the at least one gas supply path is branched into multiple branch lines and distances from the gas supply source to front ends of the respective branch lines are all the same.

In the example embodiment, conductances of the respective branch lines may be all the same.

In the example embodiment, the gas supply device may face a circular plate-shaped substrate via the processing space. Further, the gas diffusion spaces may include multiple groove-shaped spaces, and the groove-shaped spaces may be formed to face an outer side of an outer periphery of the substrate.

In the example embodiment, each of the gas distribution plates may be formed of a circular plate-shaped member, and the gas diffusion spaces may include a circular plate-shaped space formed at a central region of the circular plate-shaped member and the groove-shaped spaces formed concentrically with the circular plate-shaped space.

In the example embodiment, an additional gas may be individually supplied into each of the gas diffusion spaces from an additional gas supply source.

In another example embodiment, a substrate processing apparatus includes a processing chamber configured to accommodate a substrate in a processing space; and a gas supply device provided to face the substrate and configured to supply a gas into the processing space from a gas supply source. Further, the gas supply device includes a facing plate that faces the processing space and includes multiple through holes; multiple gas distribution plates; and a cover plate, and facing plate, the gas distribution plates, and the cover plate are stacked in sequence. In a surface, which faces the facing plate, of the gas distribution plate closest to the facing plate, multiple gas diffusion spaces are formed. Further, in each of the gas distribution plates, at least one gas supply path through which the gas is supplied into any one of the gas diffusion spaces from the gas supply source is formed, and in each of the gas distribution plates, the at least one gas supply path is branched into multiple branch lines and distances from the gas supply source to front ends of the respective branch lines are all the same.

Effect of the Invention

In accordance with the example embodiments, in each of the gas distribution plates, there is formed at least one gas supply path that supplies a gas from the gas supply source into any one of the gas diffusion spaces. Thus, it is possible to easily increase the number of gas supply paths by increasing the number of the gas distribution plates. Therefore, it is possible to divide the processing space into more regions by increasing the number of the gas diffusion spaces. Further, in each of the gas distribution plates, the gas supply path is branched into multiple branch lines, and distances from the gas supply source to the front ends of the respective branch lines are all the same. Consequently, plasma can be distributed more uniformly in the processing space.

MODE FOR CARRYING OUT THE INVENTION

Hereinafter, example embodiments will be explained with reference to the accompanying drawings.

Firstly, a substrate processing apparatus in accordance with an example embodiment will be explained.

Figure 1:
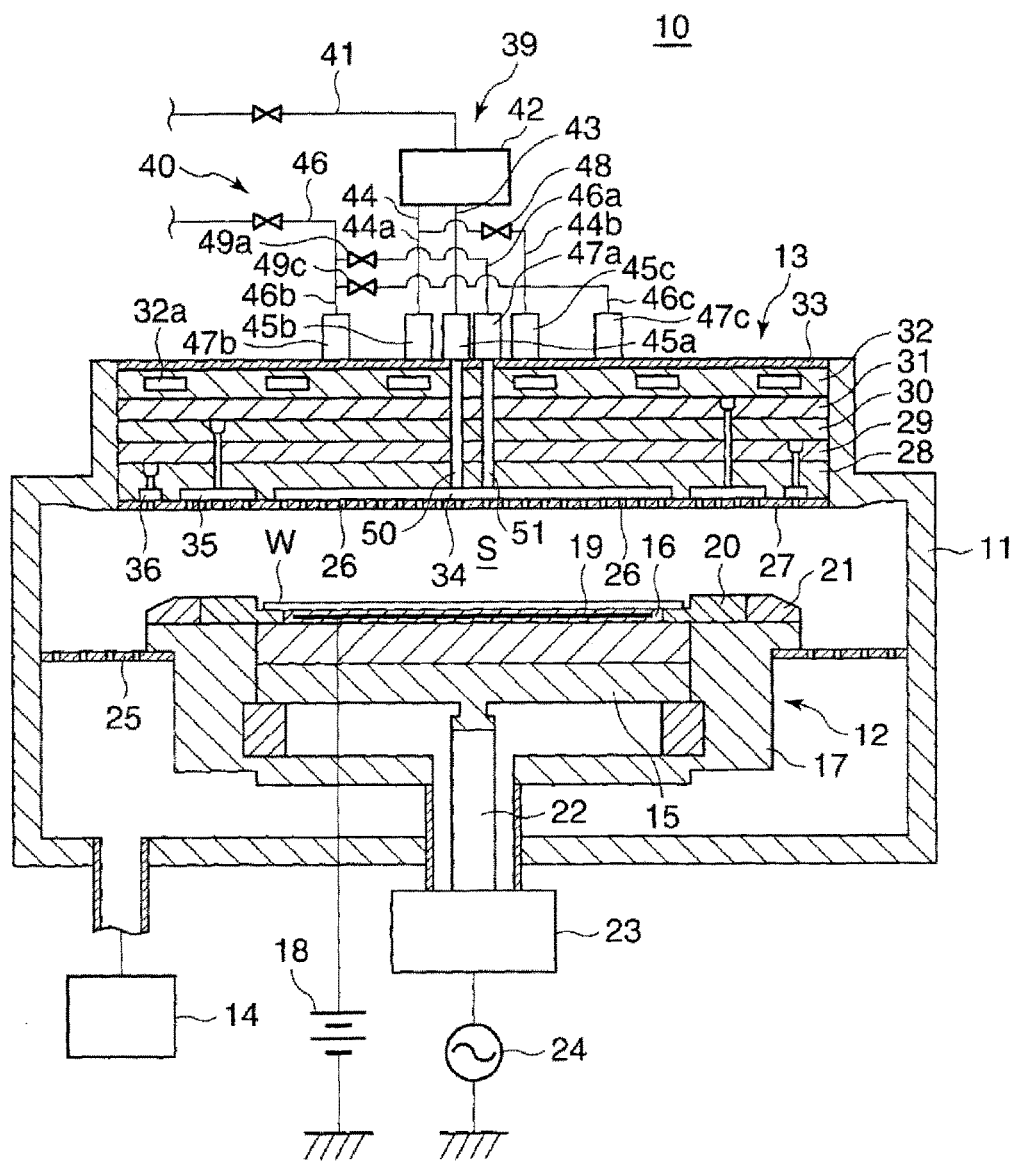
FIG. 1 is a cross-sectional view schematically illustrating a configuration of a substrate processing apparatus including a gas supply device in accordance with an example embodiment.

FIG. 1 is a cross-sectional view schematically illustrating a configuration of a substrate processing apparatus including a gas supply device in accordance with the present example embodiment.

In FIG. 1, a substrate processing apparatus 10 includes a chamber 11 (processing chamber) configured to accommodate a wafer W; a cylinder-shaped mounting table 12 provided at a substantially central region within the chamber 11 and configured to mount the wafer W thereon; a shower head 13 (gas supply device) provided at a ceiling of the chamber 11 to face the mounting table 12; and an exhaust device 14 configured to exhaust an inside of the chamber 11.

The mounting table 12 includes a cylinder-shape base member 15 made of a conductor such as aluminum; an electrostatic chuck 16 provided on an upper surface of the base member 15; and a shield 17 made of an insulator that covers a circumference of the base member 15. Further, an electrostatic electrode plate 19 connected to a DC power supply 18 is embedded within the electrostatic chuck 16. Furthermore, the mounting table 12 includes a focus ring 20 provided to surround a circumference of the wafer W and made of a semiconductor such as silicon; and a shield ring 21 provided to surround a circumference of the focus ring 20 and made of quartz.

The base member 15 of the mounting table 12 is connected to a high frequency powers supply 24 via a power supply rod 22 and a matching unit 23 provided under the power supply rod 22. The high frequency powers supply 24 is configured to supply a high frequency power to the base member 15, and a ring plate-shaped exhaust plate 25 including multiple through holes is provided around the mounting table 12.

The shower head 13 is configured to introduce a processing gas and an additional gas from an external processing gas supply source and an additional gas source, respectively, into a processing space S between the mounting table 12 and the shower head 13. A configuration of the shower head 13 will be explained in detail later.

In the substrate processing apparatus 10, the processing gas introduced into the processing space S is excited into plasma in an electric field generated in the processing space S by applying the high frequency power to the base member 15, and a preset plasma process, for example, a dry etching process, is performed on the wafer W with the plasma. When the preset plasma process is performed on the wafer W, the exhaust device 14 depressurizes the inside of the chamber 11 and the exhaust plate 25 suppresses the plasma in the processing space S from being introduced into the exhaust device 14.

Figure 2:
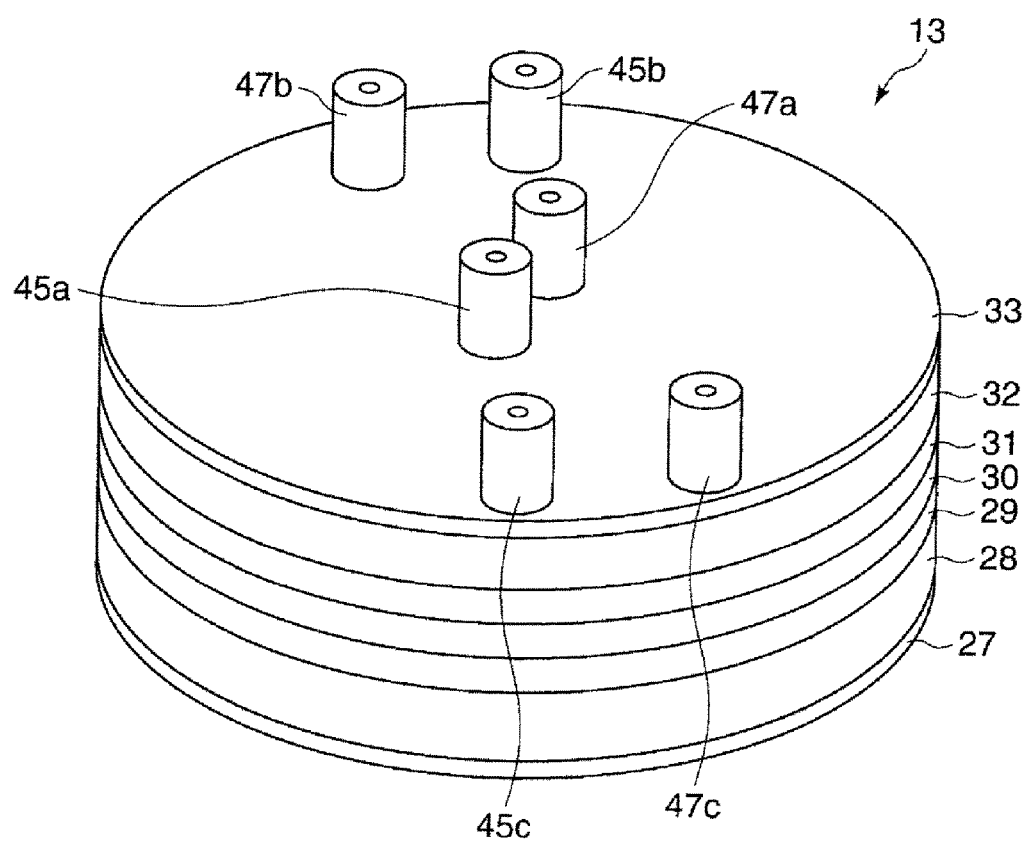
FIG. 2 is a perspective view schematically illustrating a configuration of a shower head of FIG. 1.

The shower head 13 is provided to face the processing space S and includes a facing plate 27 including multiple gas through holes 26, four gas distribution plates 28 to 31, a cooling plate 32, and a cover plate 33. All of the facing plate 27, the gas distribution plates 28 to 31, the cooling plate 32, and the cover plate 33 are formed of circular plate-shaped members having the same outer diameter and are stacked in sequence on the shower head 13, as depicted in FIG. 2.

Figure 4:
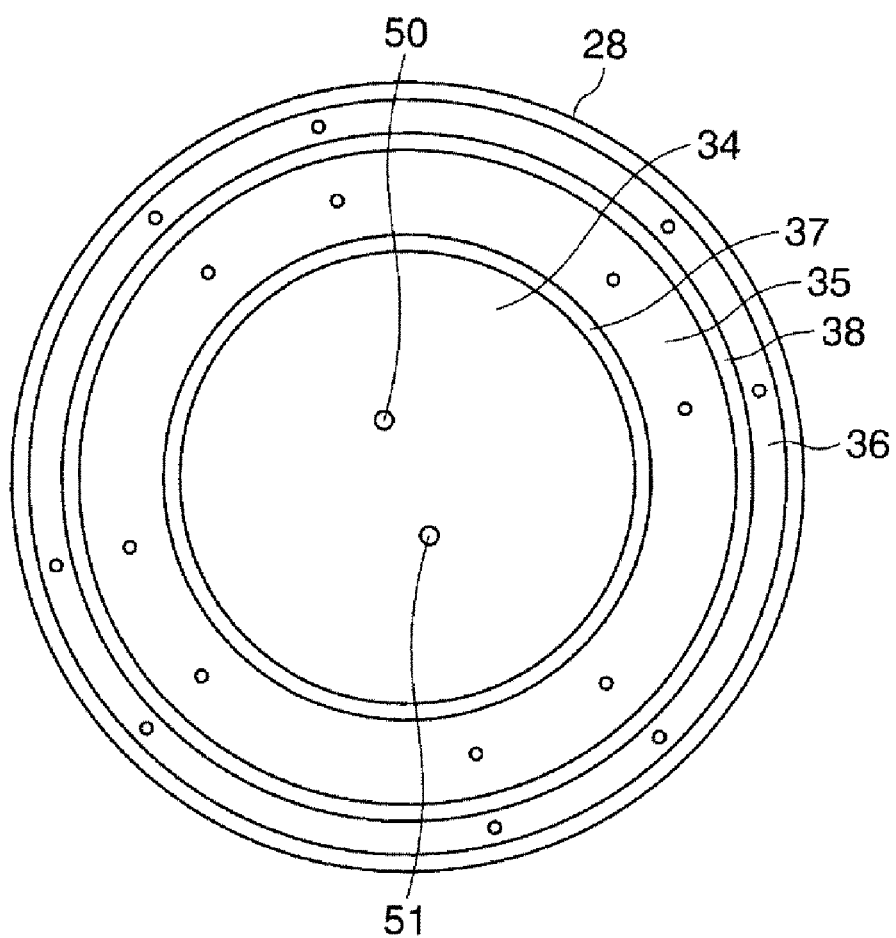
FIG. 4 is a bottom view illustrating arrangement of a central gas diffusion space, a peripheral gas diffusion space, and an outermost gas diffusion space formed in the undermost gas distribution plate.

In a surface, which faces the facing plate 27, (a lower surface in FIG. 1) of the gas distribution plate 28 closest to the facing plate 27, a central gas diffusion space 34, a peripheral gas diffusion space 35, and an outermost gas diffusion space 36 are formed. As depicted in FIG. 4, the central gas diffusion space 34 having a circular plate shape is formed at a central region of the gas distribution plate 28, and the peripheral gas diffusion space 35 and the outermost gas diffusion space 36 each having an annular groove shape are arranged to be concentric with the central gas diffusion space 34. A wall 37 is formed between the central gas diffusion space 34 and the peripheral gas diffusion space 35, and a wall 38 is formed between the peripheral gas diffusion space 35 and the outermost gas diffusion space 36. Thus, a processing gas and an additional gas supplied into the central gas diffusion space 34, the peripheral gas diffusion space 35, and the outermost gas diffusion space 36 are not mixed with each other. Further, as depicted in FIG. 1, the central gas diffusion space 34 is formed to face the wafer W mounted on the mounting table 12, and the peripheral gas diffusion space 35 and the outermost gas diffusion space 36 are formed to face the focus ring 20 or the shield ring 21 instead of the wafer W.

Further, in the shower head 13, a coolant path 32a is formed within the cooling plate 32, and an overall temperature of the shower head 13 as well as a temperature of the cooling plate 32 is adjusted by coolant circulating through the coolant path 32a.

The shower head 13 is connected to a processing gas introducing unit 39 connected with a processing gas source to introduce the processing gas, and is also connected to an additional gas introducing unit 40 connected with an additional gas source to introduce the additional gas. In the processing gas introducing unit 39, a line 41 connected with the processing gas source is branched into two lines 43 and 44 by a divider 42, and the line 44 is further branched into two lines 44a and 44b. The lines 43, 44a, and 44b are connected with the cover plate 33 via connecting members 45a to 45c, respectively, and are configured to supply the processing gas to the central gas diffusion space 34, the peripheral gas diffusion space 35, and the outermost gas diffusion space 36. Further, in the additional gas introducing unit 40, a line 46 connected with the additional gas source is branched into three lines 46a to 46c. The lines 46a to 46c are connected with the cover plate 33 via connecting members 47a to 47c, respectively, and are configured to supply the additional gas into the central gas diffusion space 34, the peripheral gas diffusion space 35, and the outermost gas diffusion space 36.

In the processing gas introducing unit 39, a valve 48 is provided at the line 44b. Flow rates of the processing gas supplied into the respective central gas diffusion space 34, the peripheral gas diffusion space 35, and the outermost gas diffusion space 36 are individually controlled by the distribution control of the processing gas with the divider 42 or by the opening/closing of the valve 48. The processing gas supplied into the central gas diffusion space 34, the peripheral gas diffusion space 35, and the outermost gas diffusion space 36 is introduced into the processing space S through the gas through holes 26 of the facing plate 27. As described above, since the flow rates of the processing gas supplied into the central gas diffusion space 34, the peripheral gas diffusion space 35, and the outermost gas diffusion space 36 are individually controlled, flow rates of the processing gas introduced into a region facing the central gas diffusion space 34 (hereinafter, referred to as "central region"), a region facing the peripheral gas diffusion space 35 (hereinafter, referred to as "peripheral region"), and a region facing the outermost gas diffusion space 36 (hereinafter, referred to as "outermost region") in the processing space S are also individually controlled. That is, the processing space S is divided into three regions (the central region, the peripheral region, and the outermost region), and the flow rates of the processing gas introduced into the central region, the peripheral region, and the outermost region are individually controlled.

In the additional gas introducing unit 40, a valve 49a is provided at the line 46a, and a valve 49c is provided at the line 46c. Flow rates of the additional gas supplied into the central gas diffusion space 34, the peripheral gas diffusion space 35, and the outermost gas diffusion space 36 are individually controlled by the opening/closing of the valves 49a and 49c. The additional gas supplied into the central gas diffusion space 34, the peripheral gas diffusion space 35, and the outermost gas diffusion space 36 is introduced into the processing space S through the gas through holes 26 of the facing plate 27. As described above, since the flow rates of the additional gas supplied into the central gas diffusion space 34, the peripheral gas diffusion space 35, and the outermost gas diffusion space 36 are individually controlled, flow rates of the additional gas introduced into the central region, the peripheral region, and the outermost region in the processing space S are also individually controlled. That is, as for the additional gas, the flow rates of the additional gas introduced into the central region, the peripheral region, and the outermost region in the processing space S are individually controlled.

In the shower head 13, the connecting member 45a and the connecting member 47a are provided at a substantially central region of the cover plate 33, and there are formed vertical gas supply paths 50 and 51 penetrating the shower head 13 in a thickness direction toward the central gas diffusion space 34 from the connecting member 45a and the connecting member 47a, respectively. As depicted in FIG. 4, since each of the vertical gas supply paths 50 and 51 is opened at a substantially central region of the central gas diffusion space 34, the processing gas and the additional gas respectively supplied into the central gas diffusion space 34 through the vertical gas supply paths 50 and 51 are freely diffused and distributed in a uniform manner within the central gas diffusion space 34. Consequently, the processing gas and the additional gas are uniformly introduced into the central region of the processing space S from the gas through holes 26 corresponding to the central gas diffusion space 34. Therefore, it is possible to uniformly distribute the processing gas and the additional gas in the central region and also possible to uniformly distribute the plasma.

Further, a gas supply path, through which the processing gas or the additional gas is distributed and supplied into the peripheral gas diffusion space 35 or the outermost gas diffusion space 36, is formed in each of the gas distribution plates 28 to 31 of the shower head 13.

Figure 5:
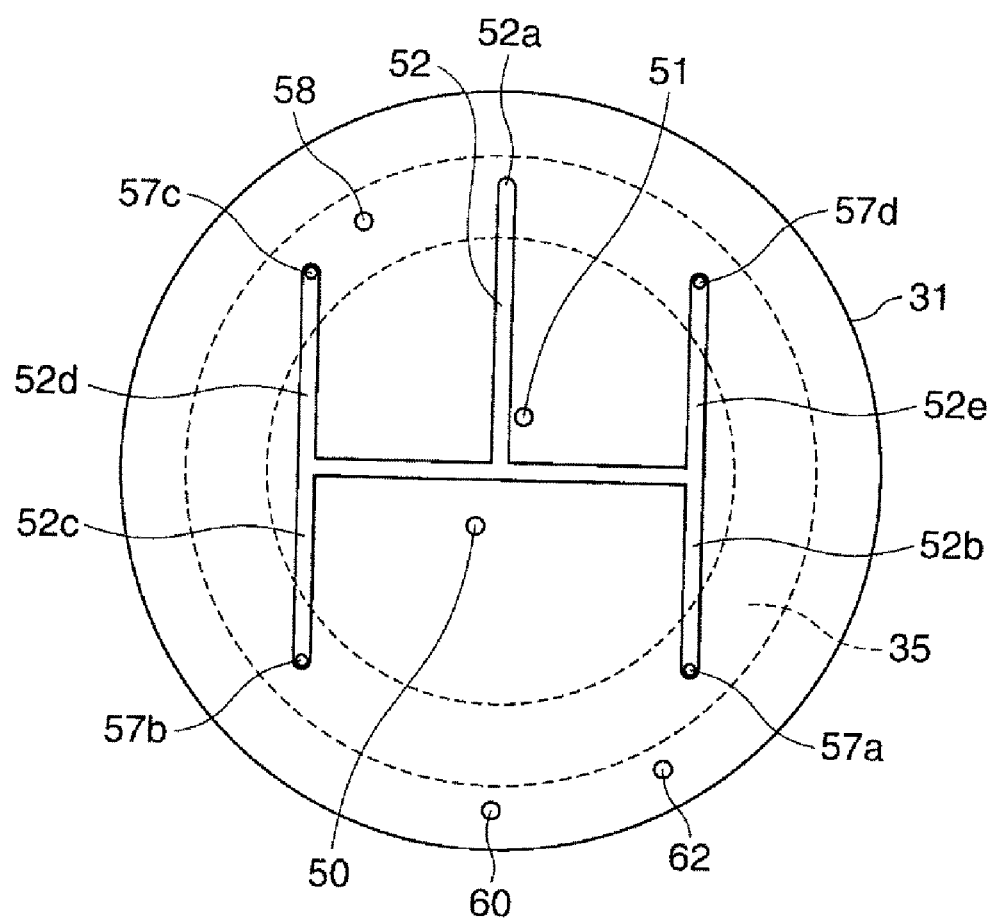
FIG. 5 is a plane view illustrating arrangement of a gas supply path that supplies a processing gas into the peripheral gas diffusion space.
Figure 6:
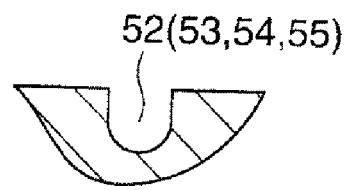
FIG. 6 is a cross-sectional view of the gas supply path of FIG. 5.
Figure 7:
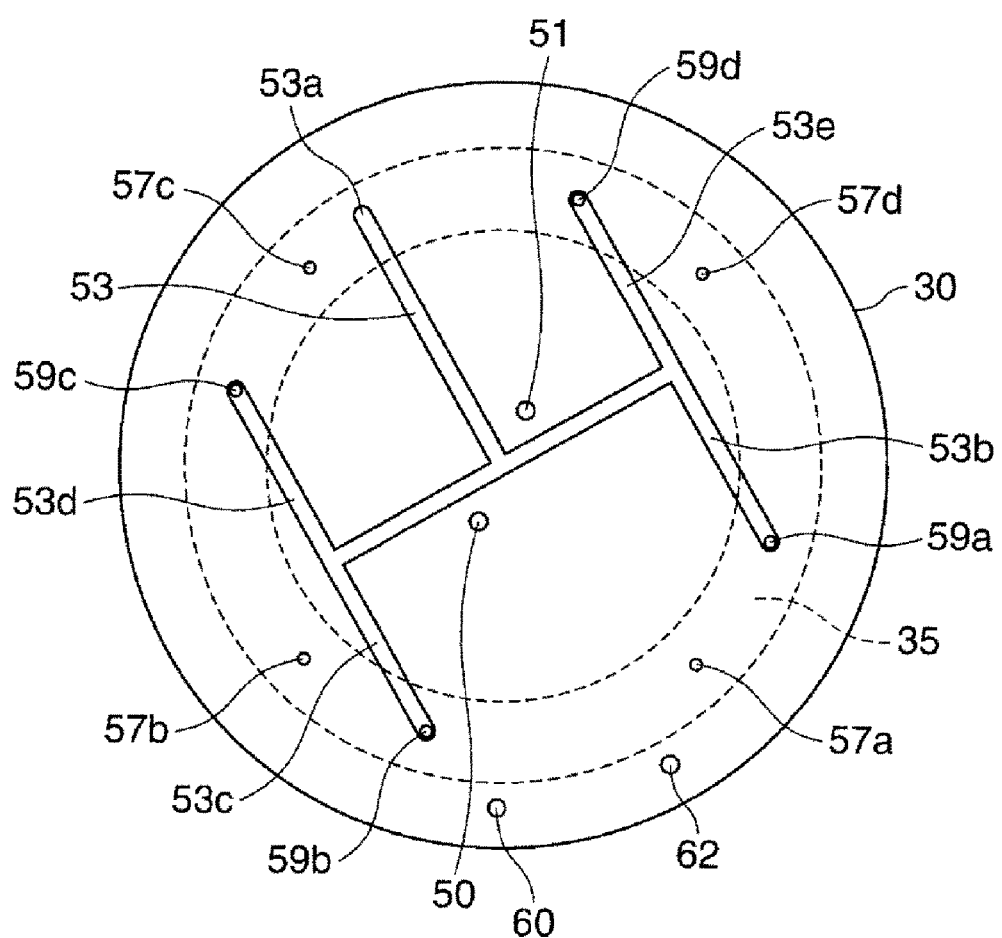
FIG. 7 is a plane view illustrating arrangement of a gas supply path that supplies an additional gas into the peripheral gas diffusion space.
Figure 8:
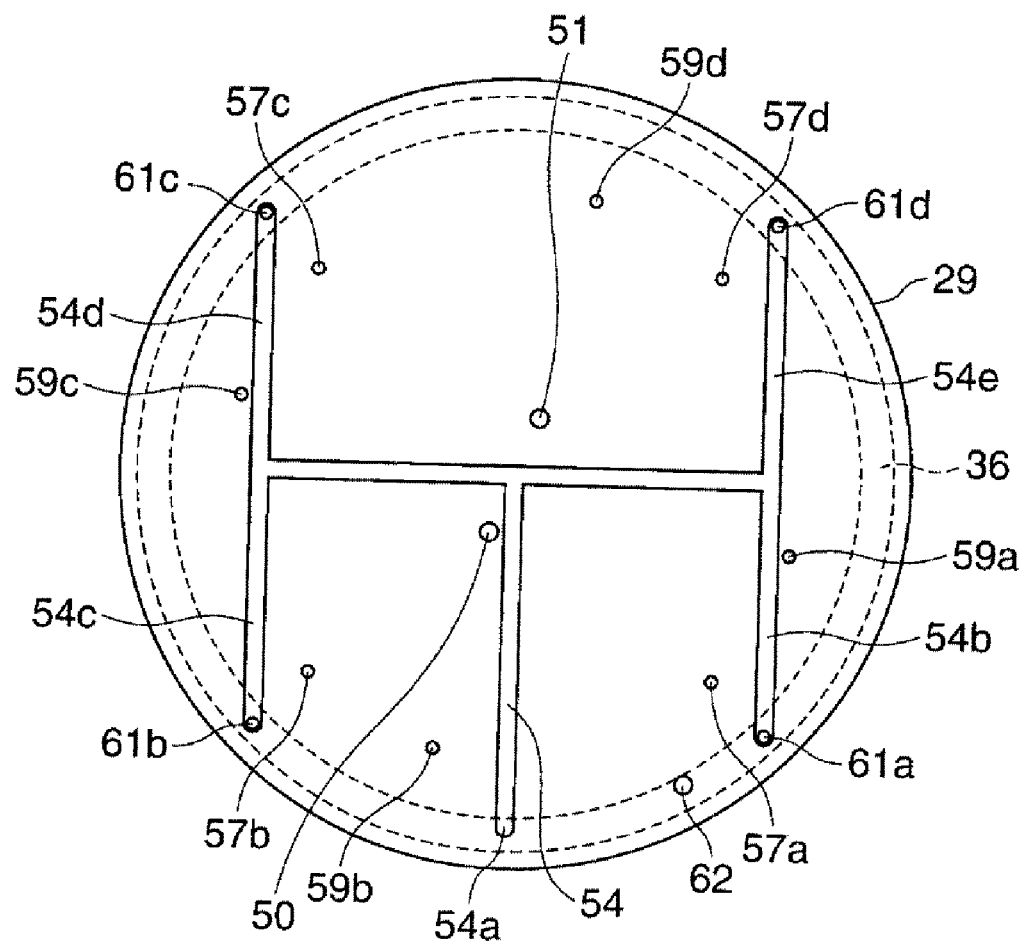
FIG. 8 is a plane view illustrating arrangement of a gas supply path that supplies the processing gas into the outermost gas diffusion space.
Figure 9:
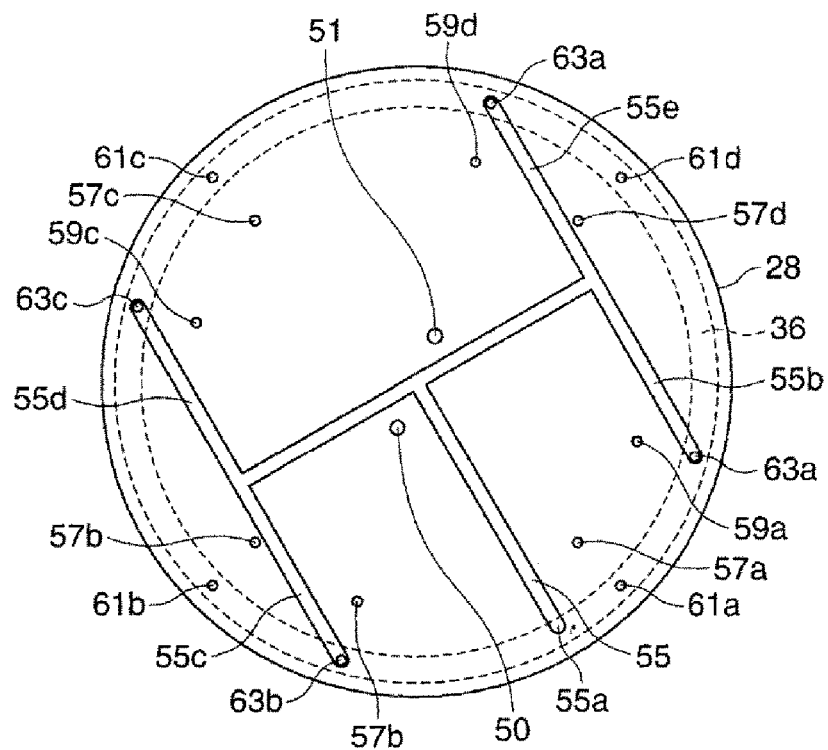
FIG. 9 is a plane view illustrating arrangement of a gas supply path that supplies the additional gas into the outermost gas diffusion space.
Figure 10:
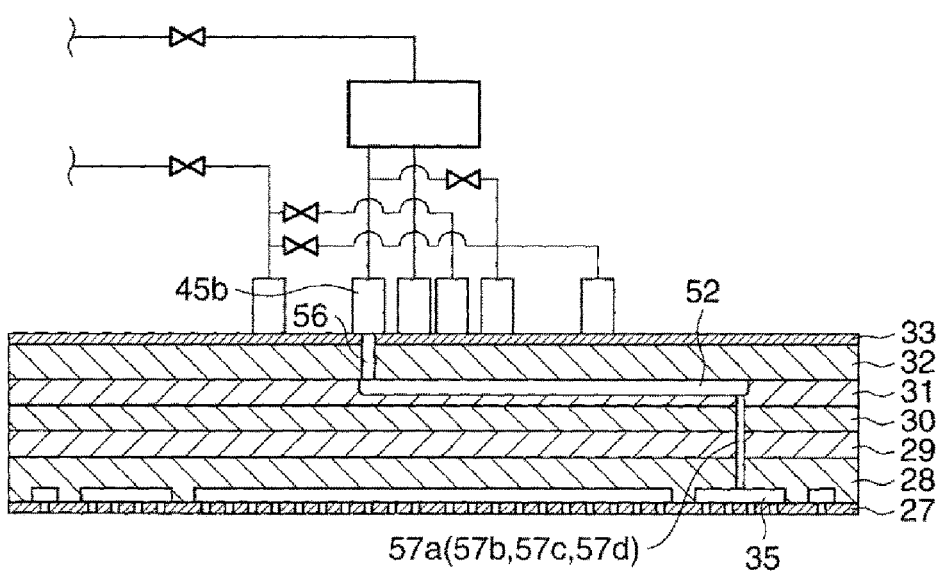
FIG. 10 is a cross-sectional view illustrating arrangement of the gas supply path that supplies the processing gas into the peripheral gas diffusion space.
Figure 11:
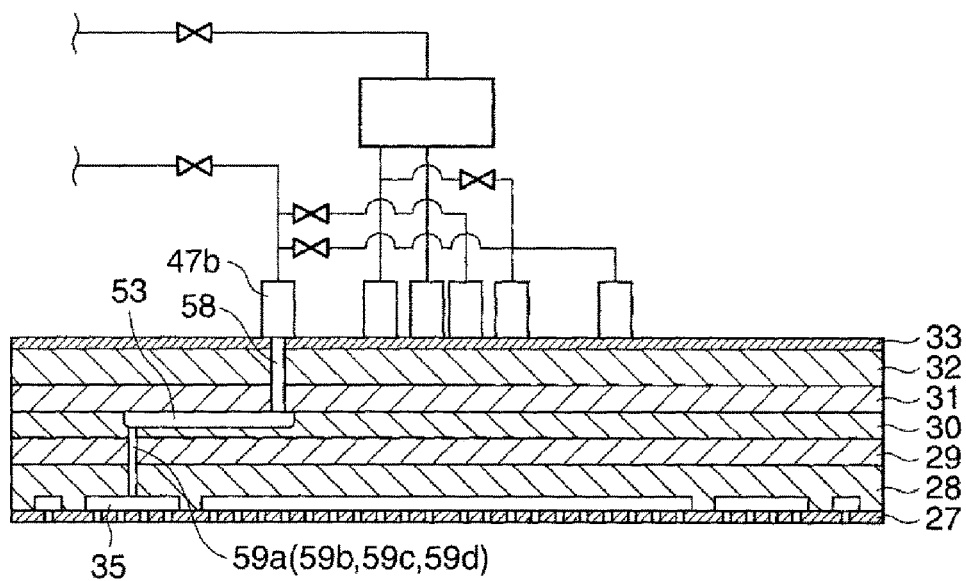
FIG. 11 is a cross-sectional view illustrating arrangement of the gas supply path that supplies the additional gas to the peripheral gas diffusion space.
Figure 12:
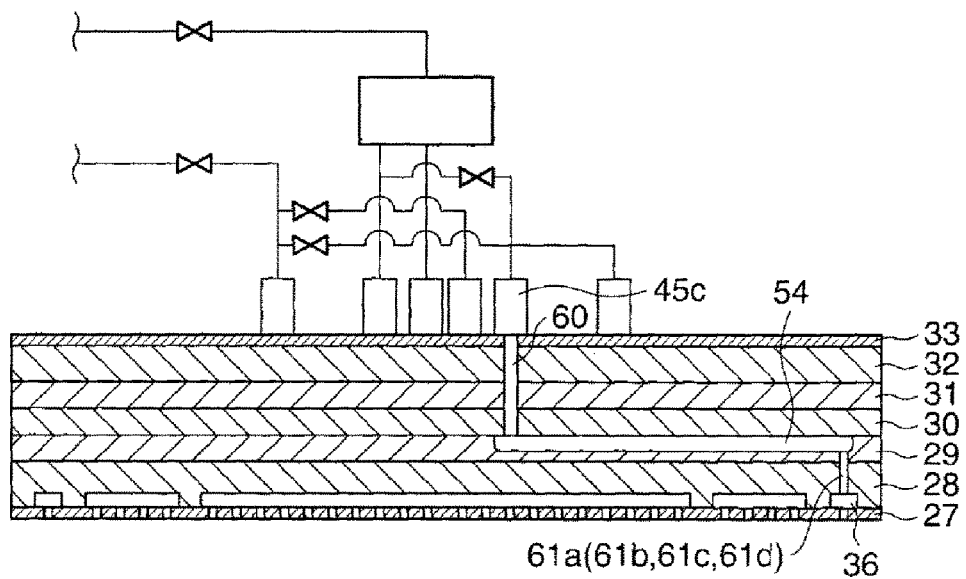
FIG. 12 is a cross-sectional view illustrating arrangement of the gas supply path that supplies the processing gas into the outermost gas diffusion space.
Figure 13:
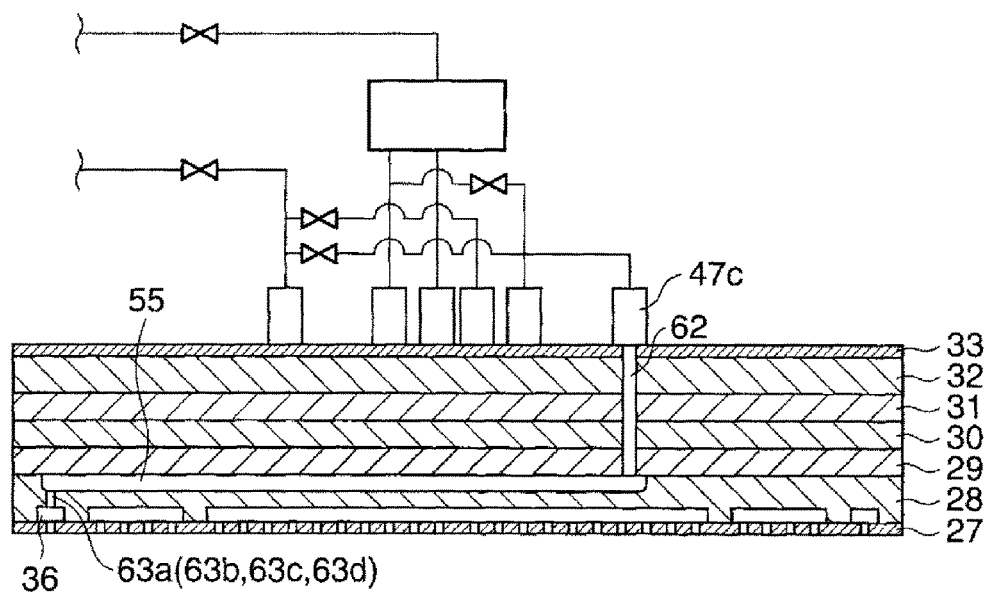
FIG. 13 is a cross-sectional view illustrating arrangement of the gas supply path that supplies the additional gas into the outermost gas diffusion space.

To be specific, as depicted in FIG. 5 and FIG. 10, in the gas distribution plate 31, there is formed a gas supply path 52 for distributing and supplying the processing gas introduced from above a surface of the cover plate 33 (an upper surface of FIG. 10) through the connecting member 45b into the peripheral gas diffusion space 35. In the gas distribution plate 30, as depicted in FIG. 7 and FIG. 11, there is formed a gas supply path 53 for distributing and supplying the additional gas introduced from above the surface of the cover plate 33 (an upper surface of FIG. 11) through the connecting member 47b into the peripheral gas diffusion space 35. In the gas distribution plate 29, as depicted in FIG. 8 and FIG. 12, there is formed a gas supply path 54 for distributing and supplying the processing gas introduced from above the surface of the cover plate 33 (an upper surface of FIG. 12) through the connecting member 45c into the outermost gas diffusion space 36. Further, in the gas distribution plate 28, as depicted in FIG. 9 and FIG. 13, there is formed a gas supply path 55 for distributing and supplying the additional gas introduced from above the surface of the cover plate 33 (an upper surface of FIG. 13) through the connecting member 47c into the outermost gas diffusion space 36. That is, a single gas supply path is formed in a single gas distribution plate. Furthermore, some configuration are omitted in FIG. 5 and FIG. 7 to FIG. 13 for simple explanation, and a cross section of each of the gas supply paths 52 to 55 has a U-shape and has a width and a depth of 5 mm to 10 mm as depicted in FIG. 6.

To be more specific, as for the processing gas to be supplied into the peripheral gas diffusion space 35, in the shower head 13, there is formed a vertical gas supply path 56 that penetrates the cover plate 33 and the cooling plate 32 in a thickness direction thereof from the connecting member 45b and communicates with a communicating portion 52a as an end portion of the gas supply path 52. Further, there are formed four vertical gas supply paths 57a to 57d each of which penetrates the gas distribution plates 28 to 31 in a thickness direction thereof from the gas supply path 52 and is opened to the peripheral gas diffusion space 35 (indicated by a dashed line in FIG. 5). The four vertical gas supply paths 57a to 57d are arranged symmetrically with respect to the center of the peripheral gas diffusion space 35 and also arranged uniformly in a circumferential direction.

The gas supply path 52 is branched from the communicating portion 52a into branch lines 52b to 52e toward the respective vertical gas supply paths 57a to 57d on an upper surface of the gas distribution plate 31, and the vertical gas supply paths 57a to 57d are opened at front ends of the branch lines 52b to 52e, respectively. In the shower head 13, distances from the communicating portion 52a to the front ends of the respective branch lines 52b to 52e are set to be all the same, so that distances from the connecting member 45b to the openings of the respective vertical gas supply paths 57a to 57d in the peripheral gas diffusion space 35 are all the same. Further, in the shower head 13, cross-sectional areas of the vertical gas supply paths 57a to 57d are set to be all the same and cross-sectional areas of the branch lines 52b to 52e are also set to be all the same, so that conductances from the connecting member 45b to the openings of the respective vertical gas supply paths 57a to 57d in the peripheral gas diffusion space 35 are all the same.

As a result, the processing gases supplied from the openings of the respective vertical gas supply paths 57a to 57d in the peripheral gas diffusion space 35 have the same flow rates, pressures, and timings. Thus, the processing gas is uniformly distributed in the peripheral gas diffusion space 35.

Further, in FIG. 5, the gas supply path 52 is branched in a H-shape when viewed from the top. The branched shape of the gas supply path 52 is not limited thereto, and the gas supply path 52 can be branched in any shape as long as distances from the communicating portion 52a to the front ends of the respective branch lines 52b to 52e are all the same.

As for the additional gas to be supplied into the peripheral gas diffusion space 35, in the shower head 13, there is formed a vertical gas supply path 58 that penetrates the cover plate 33, the cooling plate 32, and the gas distribution plate 31 in the thickness direction from the connecting member 47b and communicates with a communicating portion 53a as an end portion of the gas supply path 53. Further, there are formed four vertical gas supply paths 59a to 59d each of which penetrates the gas distribution plates 28 to 30 in the thickness direction from the gas supply path 53 and is opened to the peripheral gas diffusion space 35

(indicated by a dashed line in FIG. 7). The four vertical gas supply paths 59a to 59d are arranged symmetrically with respect to the center of the peripheral gas diffusion space 35 and also arranged uniformly in a circumferential direction.

The gas supply path 53 is branched from the communicating portion 53a into branch lines 53b to 53e toward the respective vertical gas supply paths 59a to 59d on an upper surface of the gas distribution plate 30, and the vertical gas supply paths 59a to 59d are opened at front ends of the branch lines 53b to 53e, respectively. In the shower head 13, distances from the communicating portion 53a to the front ends of the respective branch lines 53b to 53e are set to be all the same, so that distances from the connecting member 47b to the openings of the respective vertical gas supply paths 59a to 59d in the peripheral gas diffusion space 35 are all the same. Further, in the shower head 13, cross-sectional areas of the vertical gas supply paths 59a to 59d are set to be all the same and cross-sectional areas of the branch lines 53b to 53e are also set to be all the same, so that conductances from the connecting member 47b to the openings of the respective vertical gas supply paths 59a to 59d in the peripheral gas diffusion space 35 are all the same.

As a result, the additional gases supplied from the openings of the respective vertical gas supply paths 59a to 59d in the peripheral gas diffusion space 35 have the same flow rates, pressures, and timings. Thus, the additional gas is uniformly distributed in the peripheral gas diffusion space 35.

Further, in FIG. 7, the gas supply path 53 is branched in a H-shape when viewed from the top. The branched shape of the gas supply path 53 is not limited thereto, and the gas supply path 53 can be branched in any shape as long as distances from the communicating portion 53a to the front ends of the respective branch lines 53b to 53e are all the same.

As for the processing gas to be supplied into the outermost gas diffusion space 36, in the shower head 13, there is formed a vertical gas supply path 60 that penetrates the cover plate 33, the cooling plate 32, and the gas distribution plates 31 and 30 in the thickness direction from the connecting member 45c and communicates with a communicating portion 54a as an end portion of the gas supply path 54. Further, there are formed four vertical gas supply paths 61a to 61d each of which penetrates the gas distribution plates 28 and 29 in the thickness direction from the gas supply path 54 and is opened to the outermost gas diffusion space 36 (indicated by a dashed line in FIG. 8). The four vertical gas supply paths 61a to 61d are arranged symmetrically with respect to the center of the outermost gas diffusion space 36 and also arranged uniformly in a circumferential direction.

The gas supply path 54 is branched from the communicating portion 54a into branch lines 54b to 54e toward the respective vertical gas supply paths 61a to 61d on an upper surface of the gas distribution plate 29, and the vertical gas supply paths 61a to 61d are opened at front ends of the branch lines 54b to 54e, respectively. In the shower head 13, distances from the communicating portion 54a to the front ends of the respective branch lines 54b to 54e are set to be all the same, so that distances from the connecting member 45c to the openings of the respective vertical gas supply paths 61a to 61d in the outermost gas diffusion space 36 are all the same. Further, in the shower head 13, cross-sectional areas of the vertical gas supply paths 61a to 61d are set to be all the same and cross-sectional areas of the branch lines 54b to 54e are also set to be all the same, so that conductances from the connecting member 45c to the openings of the respective vertical gas supply paths 61a to 61d in the outermost gas diffusion space 36 are all the same.

As a result, the processing gases supplied from the openings of the respective vertical gas supply paths 61a to 61d in the outermost gas diffusion space 36 have the same flow rates, pressures, and timings. Thus, the processing gas is uniformly distributed in the outermost gas diffusion space 36.

Further, in FIG. 8, the gas supply path 54 is branched in a H-shape when viewed from the top. The branched shape of the gas supply path 54 is not limited thereto, and the gas supply path 54 can be branched in any shape as long as distances from the communicating portion 54a to the front ends of the respective branch lines 54b to 54e are all the same.

As for the additional gas to be supplied into the outermost gas diffusion space 36, in the shower head 13, there is formed a vertical gas supply path 62 that penetrates the cover plate 33, the cooling plate 32, and the gas distribution plates 31 to 29 in the thickness direction from the connecting member 47c and communicates with a communicating portion 55a as an end portion of the gas supply path 55. Further, there are formed four vertical gas supply paths 63a to 63d each of which penetrates the gas distribution plate 28 in the thickness direction from the gas supply path 55 and is opened to the outermost gas diffusion space 36 (indicated by a dashed line in FIG. 9). The four vertical gas supply paths 63a to 63d are arranged symmetrically with respect to the center of the outermost gas diffusion space 36 and also arranged uniformly in a circumferential direction.

The gas supply path 55 is branched from the communicating portion 55a into branch lines 55b to 55e toward the respective vertical gas supply paths 63a to 63d on an upper surface of the gas distribution plate 28, and the vertical gas supply paths 63a to 63d are opened at front ends of the branch lines 55b to 55e, respectively. In the shower head 13, distances from the communicating portion 55a to the front ends of the respective branch lines 55b to 55e are set to be all the same, so that distances from the connecting member 47c to the openings of the respective vertical gas supply paths 63a to 63d in the outermost gas diffusion space 36 are all the same. Further, in the shower head 13, cross-sectional areas of the vertical gas supply paths 63a to 63d are set to be all the same and cross-sectional areas of the branch lines 55b to 55e are also set to be all the same, so that conductances from the connecting member 47c to the openings of the respective vertical gas supply paths 63a to 63d in the outermost gas diffusion space 36 are all the same.

As a result, the additional gases supplied from the openings of the respective vertical gas supply paths 63a to 63d in the outermost gas diffusion space 36 have the same flow rates, pressures, and timings. Thus, the additional gas is uniformly distributed in the outermost gas diffusion space 36.

Further, in FIG. 9, the gas supply path 55 is branched in a H-shape when viewed from the top. The branched shape of the gas supply path 55 is not limited thereto, and the gas supply path 55 can be branched in any shape as long as distances from the communicating portion 55a to the front ends of the respective branch lines 55b to 55e are all the same.

Figure 3:
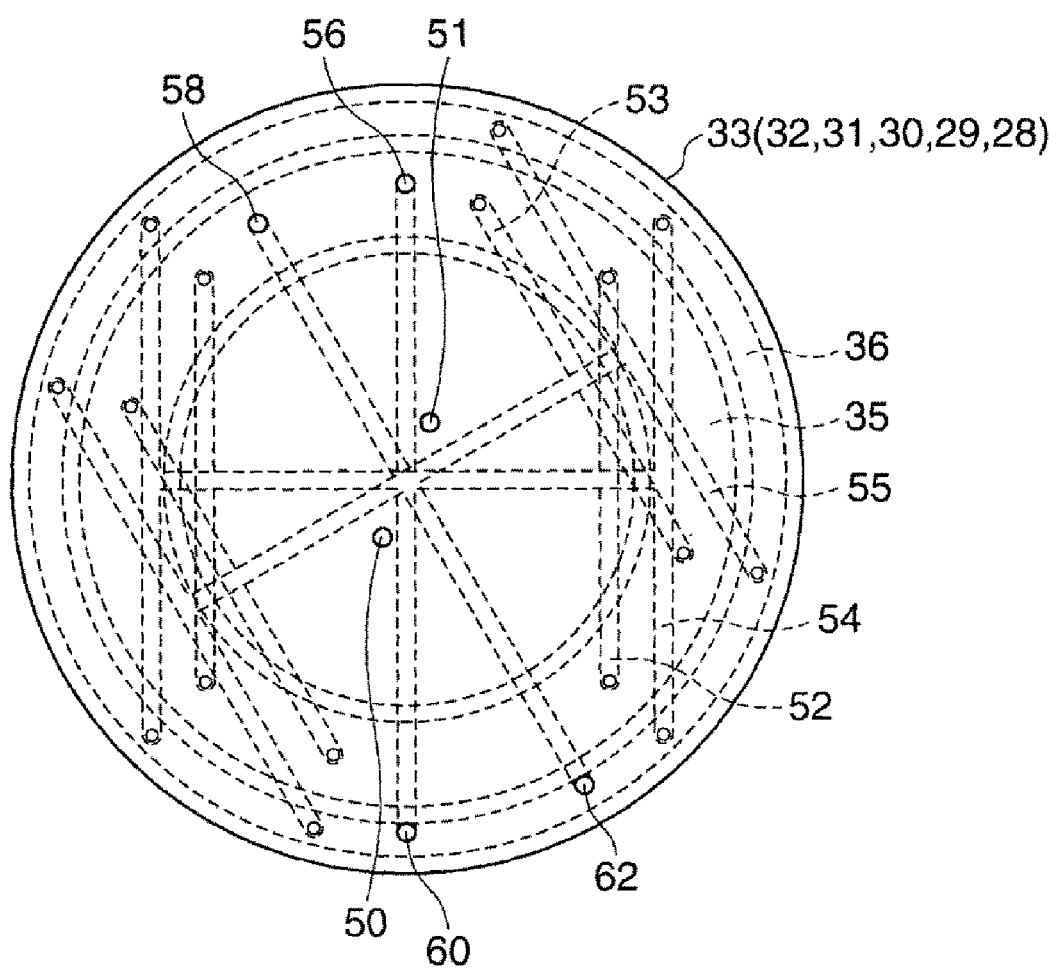
FIG. 3 is a plane view illustrating arrangement of gas supply paths when gas distribution plates, a cooling plate, and a cover plate are stacked.

In the shower head 13 as the gas supply device in accordance with the present example embodiment, in each of the gas distribution plates 28 to 31, there is formed a single gas supply path 52 (53, 54, or 55) for supplying the processing gas or the additional gas into any one of the peripheral gas diffusion space 35 or the outermost gas diffusion space 36 from the processing gas supply source or the additional gas source, respectively. That is, a single gas supply path is formed in a single gas distribution plate. Thus, even if the gas distribution plates 28 to 31, the cooling plate 32, and the cover plate 33 are stacked and thus arrangement of the gas supply paths 52 to 55 are overlapped when viewed from the top as depicted in FIG. 3, each of the gas supply paths 52 to 55 can independently supply the processing gas or the additional gas into the peripheral gas diffusion space 35 or the outermost gas diffusion space 36. In other words, in the shower head 13, there is no need to consider interference between the gas supply paths. Therefore, it is possible to easily increase the number of gas supply paths by increasing the number of gas distribution plates, so that it is possible to divide the processing space S into more regions by increasing the number of gas diffusion spaces.

Further, the conductances from the connecting member 45b to the openings of the respective vertical gas supply paths 57a to 57d in the peripheral gas diffusion space 35 are all the same, and the conductances from the connecting member 47b to the openings of the respective vertical gas supply paths 59a to 59d in the peripheral gas diffusion space 35 are all the same. Furthermore, the conductances from the connecting member 45c to the openings of the respective vertical gas supply paths 61a to 61d in the outermost gas diffusion space 36 are all the same, and the conductances from the connecting member 47c to the openings of the respective vertical gas supply paths 63a to 63d in the outermost gas diffusion space 36 are all the same. Consequently, the processing gas and the additional gas may be uniformly distributed in the peripheral gas diffusion space 35 and the outermost gas diffusion space 36. As a result, consequently, the processing gas and the additional gas may be uniformly introduced into the peripheral region and the outermost region in the processing space S, and the plasma can be more uniformly distributed in the processing space S.

The multiple gas diffusion spaces of the above-described shower head 13 includes the central gas diffusion space 34 formed into a circular plate-shape at a central region of the circular plate-shaped gas distribution plate 28, and the outermost gas diffusion space 36 and the peripheral gas diffusion space 35 formed into two annular groove-shape and arranged to be concentric with the central gas diffusion space 34. Therefore, the processing gas and the additional gas can be symmetrically introduced into the processing space S through the central gas diffusion space 34, the peripheral gas diffusion space 35, and the outermost gas diffusion space 36, and the plasma generated from the processing gas and the additional gas can be more uniformly distributed in the processing space.

Further, in the above-described shower head 13, the peripheral gas diffusion space 35 and the outermost gas diffusion space 36 is formed to face the shield ring 21 or the focus ring 20 positioned further outside than the outer periphery of the wafer W. Thus, by controlling a flow rate of the processing gas and the additional gas to be introduced from the peripheral gas diffusion space 35 and the outermost gas diffusion space 36, it is possible to securely control distribution of the processing gas and the additional gas introduced from the vicinity of the outer periphery of the wafer W, so that distribution of the plasma in the vicinity of the outer periphery of the wafer W can be controlled in more detail.

Furthermore, in the above-described shower head 13, the additional gas is individually supplied into the central gas diffusion space 34, the peripheral gas diffusion space 35, or the outermost gas diffusion space 36. Thus, it is possible to control effects of the additional gas for each of the central region, the peripheral region, and the outermost region in the processing space S, so that distribution of plasma in the processing space S can be controlled in more detail.

Moreover, in the above-described shower head 13, although the number of the vertical gas supply paths each corresponding to the gas distribution plates 28 to 31 is four, if the openings of the respective vertical gas supply paths in the peripheral gas diffusion space 35 and the outermost gas diffusion space 36 are arranged symmetrically with respect to the center of the peripheral gas diffusion space 35 and the outermost gas diffusion space 36 and also arranged uniformly in the circumferential direction, the number of the vertical gas supply paths is not limited thereto. Further, the gas distribution plates 28 to 31 may not be stacked in this sequence and can be changed in sequence of stacking the gas distribution plates 28 to 31 as long as each vertical gas supply path 56, 57a to 57d, 58, 59a to 59d, 60, 61a to 61d, 62, and 63a to 63d does not interfere with each other.

Figure 14:
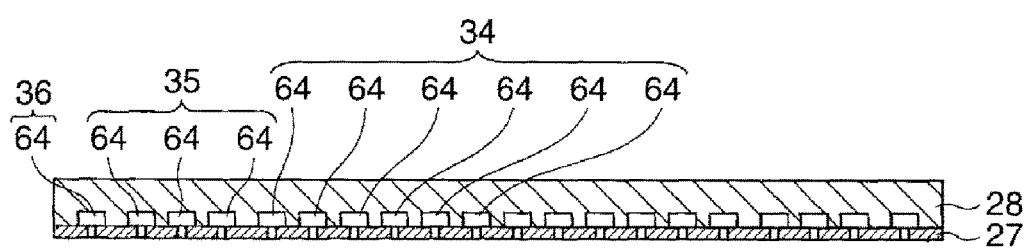
FIG. 14 is a cross-sectional view illustrating a modification example of arrangement of a central gas diffusion space, a peripheral gas diffusion space, and an outermost gas diffusion space formed in the undermost gas distribution plate.
Figure 15:
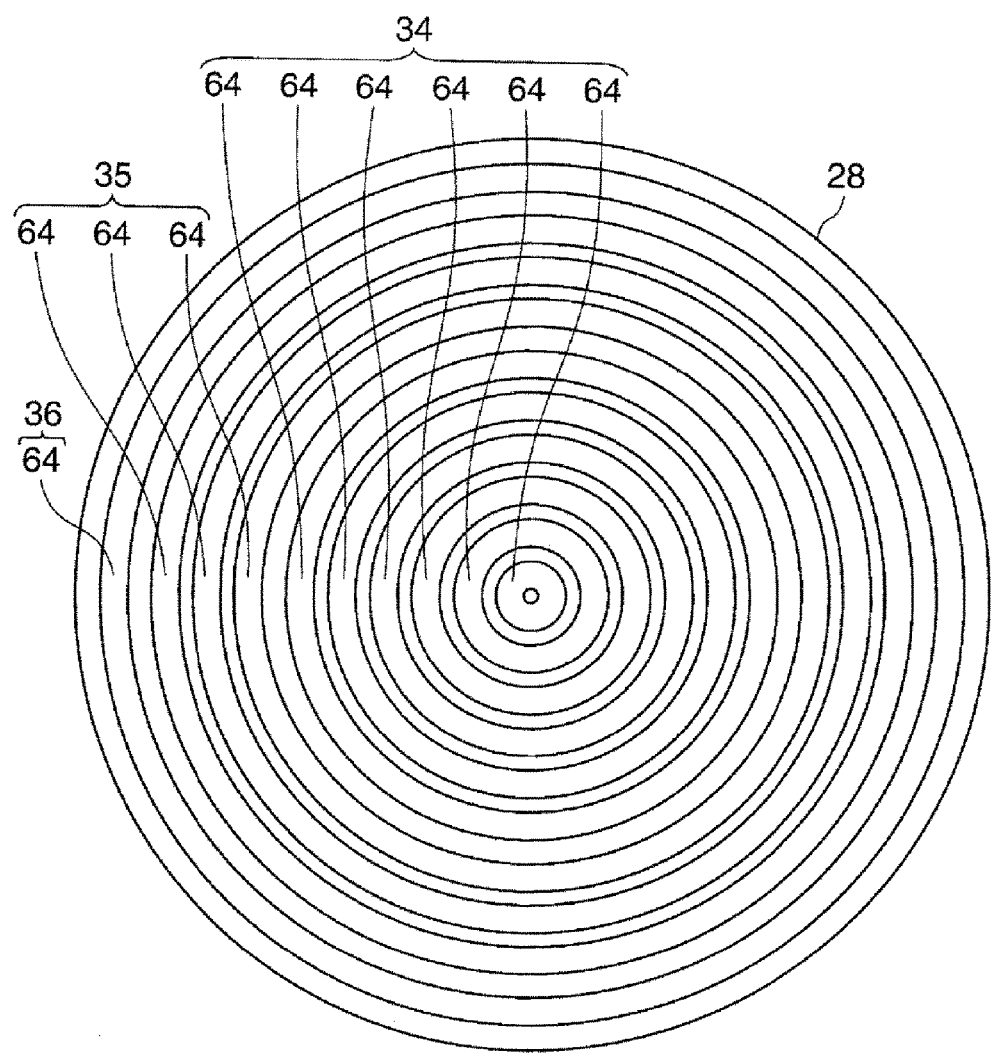
FIG. 15 is a bottom view illustrating the modification example of arrangement of a central gas diffusion space, a peripheral gas diffusion space, and an outermost gas diffusion space formed in the undermost gas distribution plate.

Further, in the above-described shower head 13, each of the central gas diffusion space 34, the peripheral gas diffusion space 35, and the outermost gas diffusion space 36 is formed of a single space. By way of example, as depicted in FIG. 14 and FIG. 15, multiple annular groove-shaped spaces 64 may be concentrically formed in a lower surface of the gas distribution plate 28, and the annular groove-shaped spaces 64 may be assigned to the central gas diffusion space 34, the peripheral gas diffusion space 35, and the outermost gas diffusion space 36. By way of example, in FIG. 14 and FIG. 15, the six inner annular groove-shaped spaces 64 may belong to the central gas diffusion space 34, the three annular groove-shaped spaces 64 outside the central gas diffusion space 34 may belong to the peripheral gas diffusion space 35, and the outermost annular groove-shaped space 64 may belong to the outermost gas diffusion space 36. Further, in FIG. 14, the gas supply path 55 is omitted.

The present disclosure has been explained with reference to the example embodiment but is not limited to the above-described example embodiment.

Figure 16:
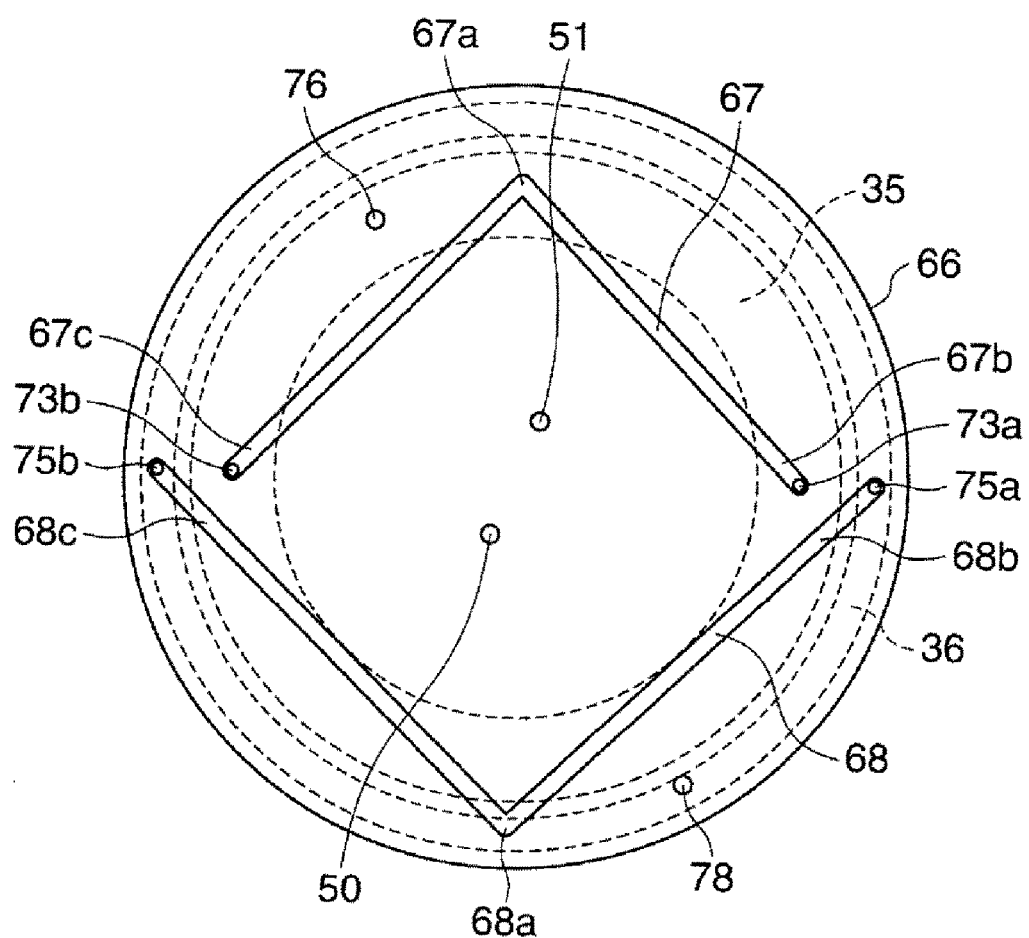
FIG. 16 is a plane view illustrating arrangement of a gas supply path that supplies a processing gas into a peripheral gas diffusion space and an outermost gas diffusion space in a first modification example of the gas supply device in accordance with the example embodiment.
Figure 17:
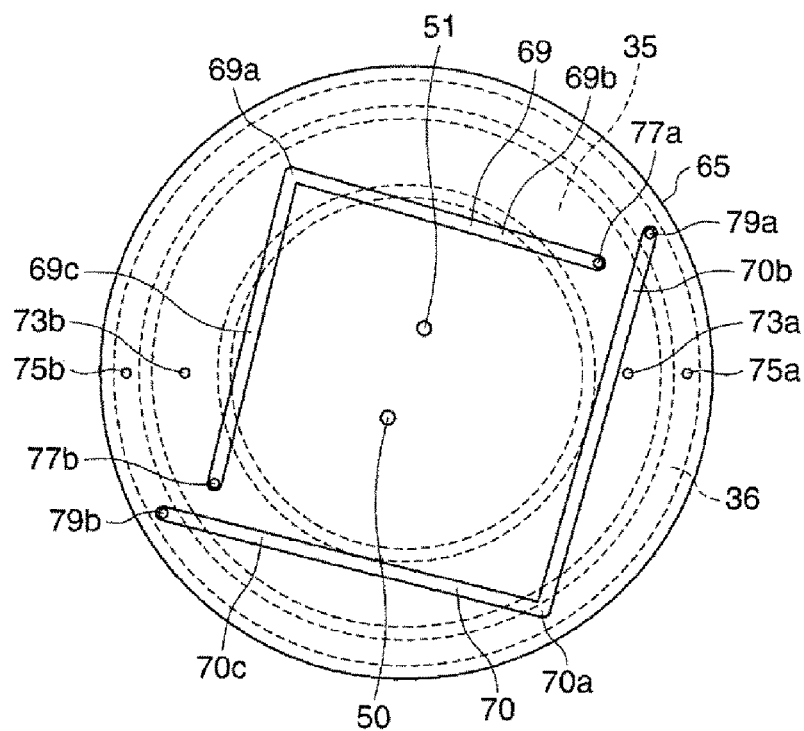
FIG. 17 is a plane view illustrating arrangement of a gas supply path that supplies an additional gas into the peripheral gas diffusion space and the outermost gas diffusion space in accordance with the first modification example.
Figure 18:
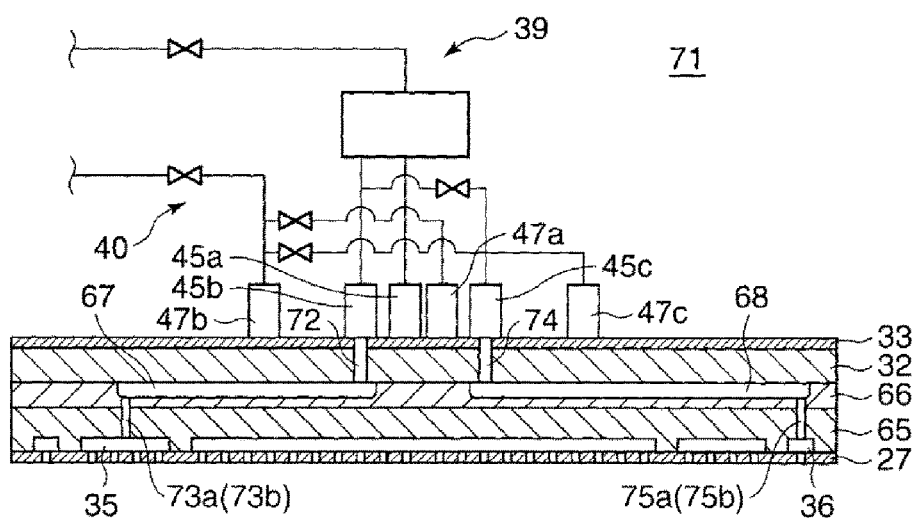
FIG. 18 is a cross-sectional view illustrating arrangement of the gas supply path that supplies a processing gas into the peripheral gas diffusion space and the outermost gas diffusion space in accordance with the first modification example.
Figure 19:
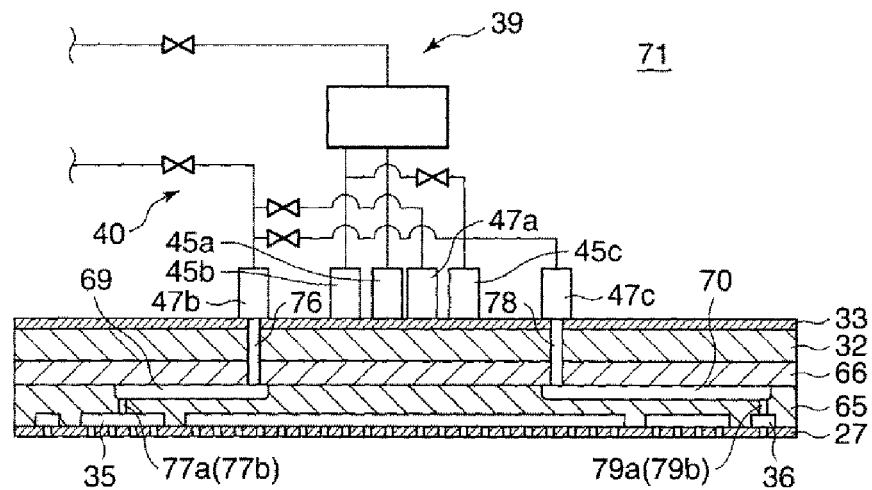
FIG. 19 is a cross-sectional view illustrating arrangement of the gas supply path that supplies the additional gas into the peripheral gas diffusion space and the outermost gas diffusion space in accordance with the first modification example.

By way of example, in the above-described shower head 13, a single gas supply path is formed in a single gas distribution plate. However, two gas supply paths may be formed in a single gas distribution plate. To be specific, a shower head 71 may include the facing plate 27, two gas distribution plates 65 and 66 each formed of a circular plate-shaped member, the cooling plate 32, and the cover plate 33 stacked in sequence from the bottom. In the gas distribution plate 65 like the gas distribution plate 28, the central gas diffusion space 34, the peripheral gas diffusion space 35, and the outermost gas diffusion space 36 are formed. In the gas distribution plate 66, as depicted in FIG. 16 and FIG. 18, there is formed a gas supply path 67 for distributing and supplying the processing gas introduced from above a surface of the cover plate 33 (an upper surface of FIG. 18) through the connecting member 45b into the peripheral gas diffusion space 35, and also, there is formed a gas supply path 68 for distributing and supplying the processing gas through the connecting member 45c into the outermost gas diffusion space 36. Further, in the gas distribution plate 65, as depicted in FIG. 17 and FIG. 19, there is formed a gas supply path 69 for distributing and supplying the additional gas introduced from above the surface of the cover plate 33 (an upper surface of FIG. 19) through the connecting member 47b into the peripheral gas diffusion space 35. Furthermore, in the gas distribution plate 65, there is formed a gas supply path 70 for distributing and supplying the additional gas through the connecting member 47c into the outermost gas diffusion space 36. Moreover, some configurations are omitted in FIG. 16 and FIG. 19 for simple explanation.

Figure 21:
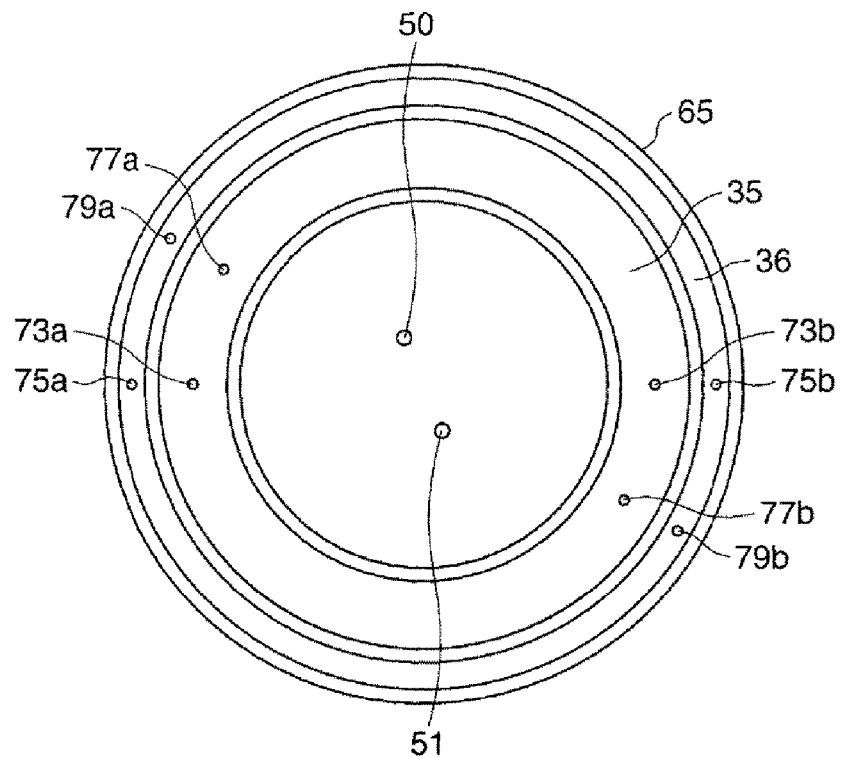
FIG. 21 is a bottom view illustrating arrangement of the central gas diffusion space, the peripheral gas diffusion space, and the outermost gas diffusion space formed in the undermost gas distribution plate in accordance with first modification example.

To be more specific, as for the processing gas to be supplied into the peripheral gas diffusion space 35, in the shower head 71, there is formed a vertical gas supply path 72 that communicates with a communicating portion 67a as an end portion of the gas supply path 67 from the connecting member 45b. Further, there are formed two vertical gas supply paths 73a and 73b each of which penetrates the gas distribution plates 65 and 66 in a thickness direction thereof from the gas supply path 67 and is opened to the peripheral gas diffusion space 35 (indicated by a dashed line in FIG. 16). The two vertical gas supply paths 73a and 73b are arranged symmetrically with respect to the center of the peripheral gas diffusion space 35 and also arranged uniformly in a circumferential direction (see FIG. 21).

The gas supply path 67 is branched from the communicating portion 67a into branch lines 67b and 67c toward the respective vertical gas supply paths 73a and 73b on an upper surface of the gas distribution plate 66, and the vertical gas supply paths 73a and 73b are opened at front ends of the branch lines 67b and 67c, respectively. In the shower head 71, distances from the communicating portion 67a to the front ends of the respective branch lines 67b and 67c, cross-sectional areas of the vertical gas supply paths 73a and 73b are set to be all the same, and cross-sectional areas of the branch lines 67b and 67c are also set to be all the same, so that conductances from the connecting member 45b to the openings of the respective vertical gas supply paths 73a and 73b in the peripheral gas diffusion space 35 are all the same.

Further, as for the processing gas to be supplied into the outermost gas diffusion space 36, in the shower head 71, there is formed a vertical gas supply path 74 that communicates with a communicating portion 68a as an end portion of the gas supply path 68 from the connecting member 45c. Further, there are formed two vertical gas supply paths 75a and 75b each of which penetrates the gas distribution plates 65 and 66 in the thickness direction from the gas supply path 68 and is opened to the outermost gas diffusion space 36 (indicated by a dashed line in FIG. 16). The two vertical gas supply paths 75a and 75b are arranged symmetrically with respect to the center of the outermost gas diffusion space 36 and also arranged uniformly in a circumferential direction (see FIG. 21).

The gas supply path 68 is branched from the communicating portion 68a into branch lines 68b and 68c toward the respective vertical gas supply paths 75a and 75b on the upper surface of the gas distribution plate 66, and the vertical gas supply paths 75a and 75b are opened at front ends of the branch lines 68b and 68c, respectively. In the shower head 71, distances from the communicating portion 68a to the front ends of the respective branch lines 68b and 68c are set to be all the same, cross-sectional areas of the vertical gas supply paths 75a and 75b are set to be all the same and cross-sectional areas of the branch lines 68b and 68c are also set to be all the same, so that conductances from the connecting member 45c to the openings of the respective vertical gas supply paths 75a and 75b in the outermost gas diffusion space 36 are all the same.

Further, in FIG. 16, the gas supply path 67 is branched in a V-shape when viewed from the top, and the gas supply path 68 is also branched in a V-shape when viewed from the top. The branched shape of the gas supply paths 67 and 68 is not limited thereto, and the gas supply paths 67 and 68 can be branched in any shape as long as distances from the communicating portion 67a to the front ends of the respective branch lines 67b and 67c are all the same and distances from the communicating portion 68a to the front ends of the respective branch lines 68b and 68c are all the same.

As for the additional gas to be supplied into the peripheral gas diffusion space 35, in the shower head 71, there is formed a vertical gas supply path 76 that communicates with a communicating portion 69a as an end portion of the gas supply path 69 from the connecting member 47b. Further, there are formed two vertical gas supply paths 77a to 77b each of which penetrates the gas distribution plate 65 in the thickness direction from the gas supply path 69 and is opened to the peripheral gas diffusion space 35 (indicated by a dashed line in FIG. 17). The two vertical gas supply paths 77a to 77b are arranged symmetrically with respect to the center of the peripheral gas diffusion space 35 and also arranged uniformly in a circumferential direction (see FIG. 21). The gas supply path 69 is branched from the communicating portion 69a into branch lines 69b and 69c toward the respective vertical gas supply paths 77a to 77b on an upper surface of the gas distribution plate 65, and the vertical gas supply paths 77a to 77b are opened at front ends of the branch lines 69b and 69c, respectively. In the shower head 71, distances from the communicating portion 69a to the front ends of the respective branch lines 69b and 69c are set to be all the same. Further, cross-sectional areas of the vertical gas supply paths 77a to 77b are set to be all the same and cross-sectional areas of the branch lines 69b and 69c are also set to be all the same. Consequently, conductances from the connecting member 47b to the openings of the respective vertical gas supply paths 77a to 77b in the peripheral gas diffusion space 35 are all the same.

Further, as for the additional gas to be supplied into the outermost gas diffusion space 36, in the shower head 71, there is formed a vertical gas supply path 78 that communicates with a communicating portion 70a as an end portion of the gas supply path 70 from the connecting member 47c. Further, there are formed two vertical gas supply paths 79a and 79b each of which penetrates the gas distribution plate 65 in the thickness direction from the gas supply path 70 and is opened to the outermost gas diffusion space 36 (indicated by a dashed line in FIG. 17). The two vertical gas supply paths 79a and 79b are arranged symmetrically with respect to the center of the outermost gas diffusion space 36 and also arranged uniformly in a circumferential direction (see FIG. 21).

The gas supply path 70 is branched from the communicating portion 70a into branch lines 70b and 70c toward the respective vertical gas supply paths 79a and 79b on the upper surface of the gas distribution plate 65, and the vertical gas supply paths 79a and 79b are opened at front ends of the branch lines 70b and 70c, respectively. In the shower head 71, distances from the communicating portion 70a to the front ends of the respective branch lines 70b and 70c are set to be all the same, and cross-sectional areas of the vertical gas supply paths 79a and 79b are set to be all the same. Further, cross-sectional areas of the branch lines 70b and 70c are also set to be all the same. Thus, conductances from the connecting member 47c to the openings of the respective vertical gas supply paths 79a and 79b in the outermost gas diffusion space 36 are all the same.

Further, in FIG. 17, the gas supply path 69 is branched in a V-shape when viewed from the top, and the gas supply path 70 is also branched in a V-shape when viewed from the top. The branched shape of the gas supply paths 69 and 70 is not limited thereto, and the gas supply paths 69 and 70 can be branched in any shape as long as distances from the communicating portion 69a to the front ends of the respective branch lines 69b and 69c are all the same and distances from the communicating portion 70a to the front ends of the respective branch lines 70b and 70c are all the same.

Figure 20:
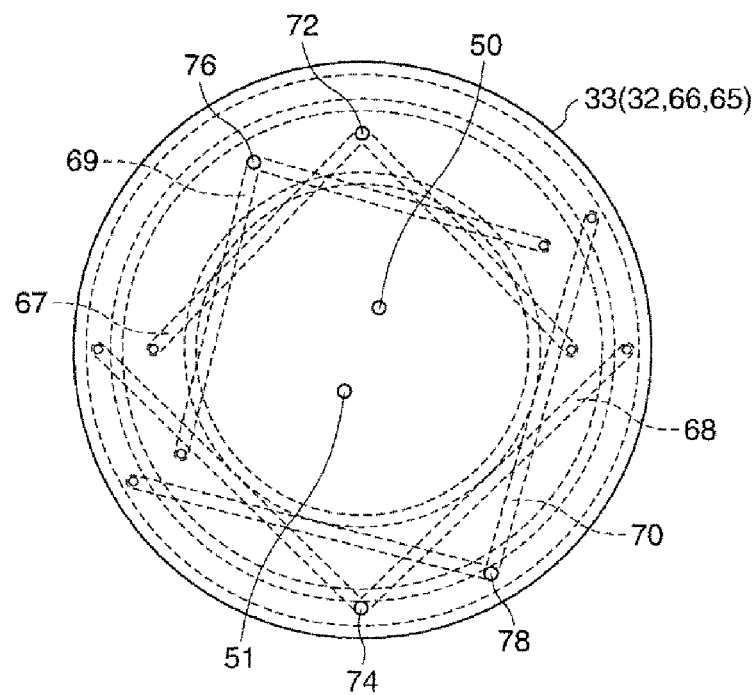
FIG. 20 is a plane view illustrating arrangement of gas supply paths when gas distribution plates, a cooling plate, and a cover plate are stacked in accordance with the first modification example.

In the shower head 71, two gas supply paths are formed in a single gas distribution plate. Since multiple gas distribution plates are stacked, even if the gas distribution plates 65 and 66, the cooling plate 32, and the cover plate 33 are stacked and thus arrangement of the gas supply paths 67 to 70 are overlapped when viewed from the top as depicted in FIG. 20, there is no need to consider the interference between the gas supply paths 67 to 70. Therefore, it is possible to easily increase the number of gas supply paths by increasing the number of gas distribution plates, and, thus, it is possible to divide the processing space S into more regions by increasing the number of gas diffusion spaces.

In the shower head 13 and the shower head 71 described above, the processing gas and the additional gas is uniformly distributed in the peripheral gas diffusion space 35 and the outermost gas diffusion space 36 by uniformly supplying the processing gas and the additional gas into the peripheral gas diffusion space 35 and the outermost gas diffusion space 36 through the gas supply paths formed in the gas distribution plates. However, by vertically forming two gas diffusion spaces that are vertically arranged to communicate with each other, the processing gas and the additional gas may be uniformly distributed in each of the gas diffusion spaces.

Figure 22:
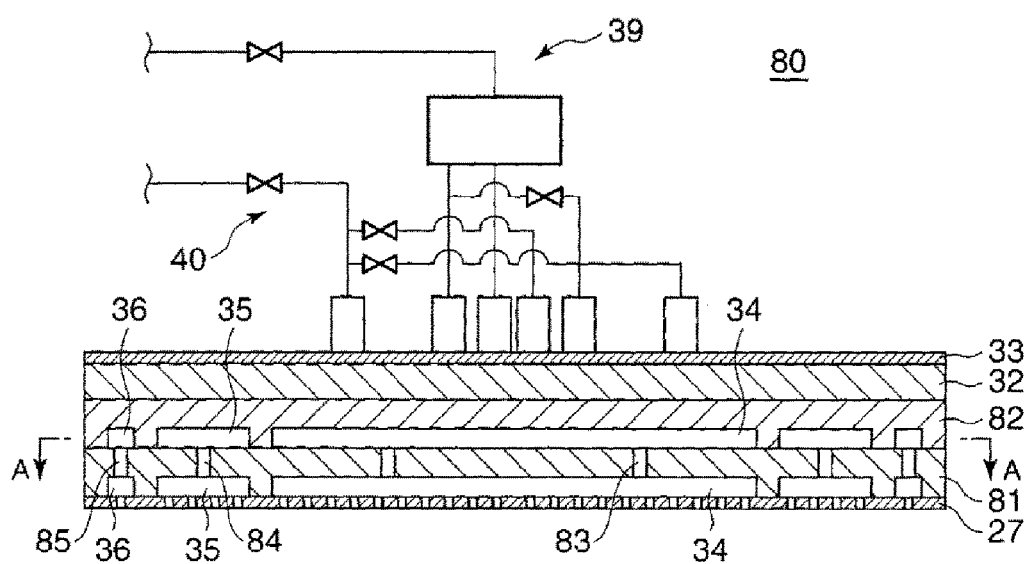
FIG. 22 is a cross-sectional view illustrating arrangement of a central gas diffusion space, a peripheral gas diffusion space, and an outermost gas diffusion space in a second modification example of the gas supply device in accordance with the example embodiment.
Figure 23:
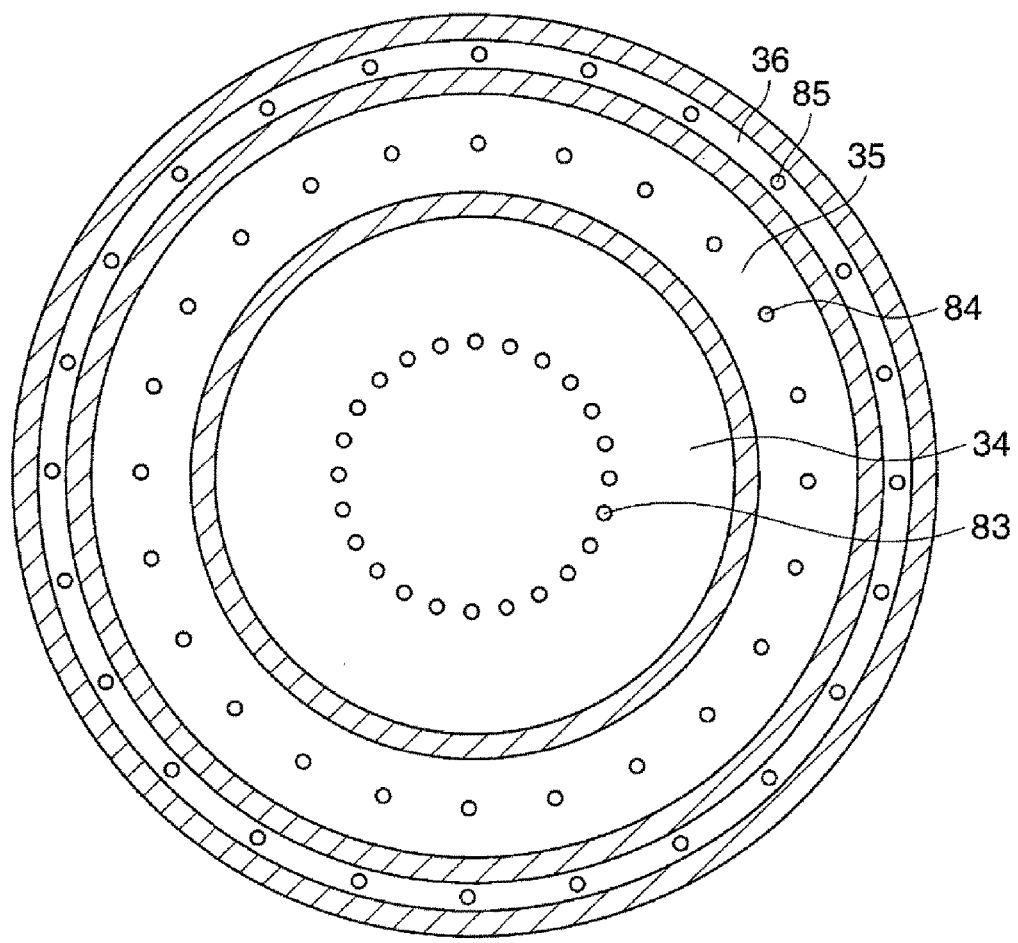
FIG. 23 is a cross-sectional view taken along a line A-A of FIG. 22.
Figure 24:
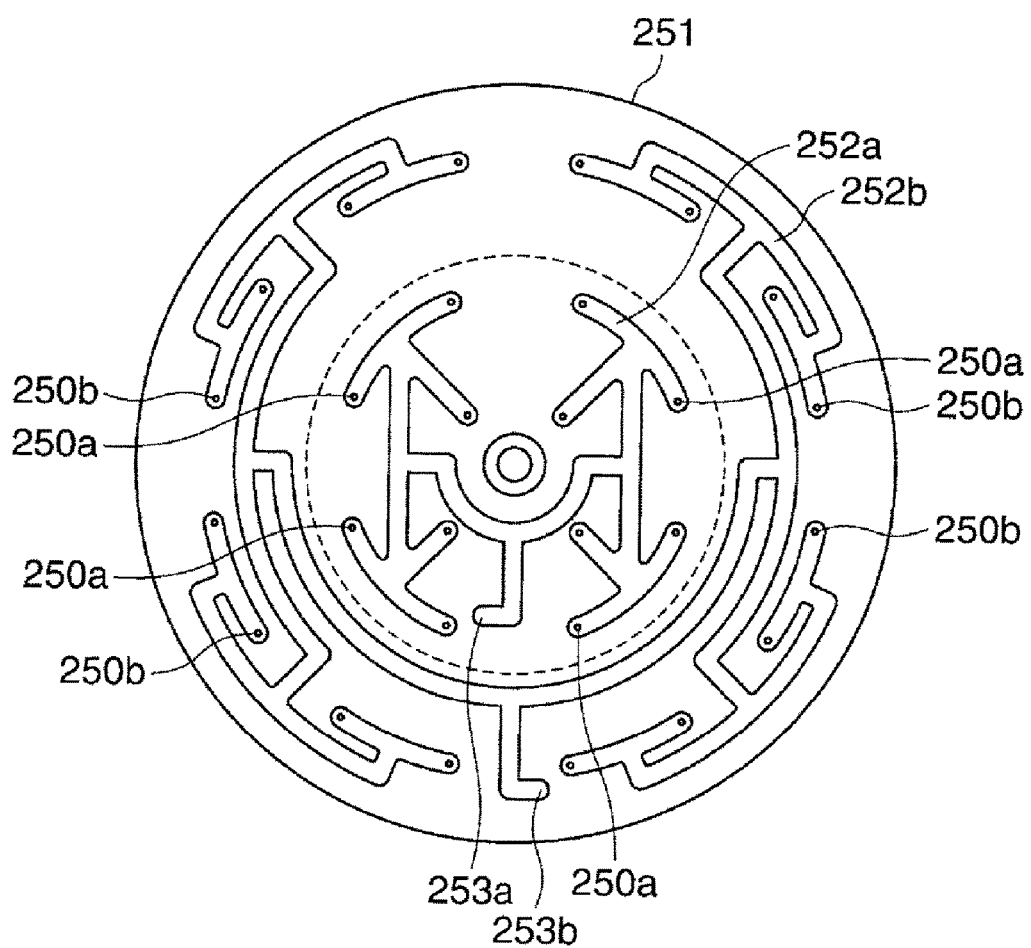
FIG. 24 is a plane view schematically illustrating a configuration of a conventional gas distribution plate.

To be specific, as depicted in FIG. 22 and FIG. 23, a shower head 80 includes the facing plate 27, two gas distribution plates 81 and 82 each formed of a circular plate-shaped member, the cooling plate 32, and the cover plate 33 stacked in sequence from the bottom. In the gas distribution plate 81 like the gas distribution plate 28, the central gas diffusion space 34, the peripheral gas diffusion space 35, and the outermost gas diffusion space 36 are formed. Further, in the gas distribution plate 82 like the gas distribution plate 81, the central gas diffusion space 34, the peripheral gas diffusion space 35, and the outermost gas diffusion space 36 are formed.

The central gas diffusion space 34 (hereinafter, referred to as "lower central gas diffusion space 34) of the gas distribution plate 81 and the central gas diffusion space 34 (hereinafter, referred to as "upper central gas diffusion space 34) of the gas distribution plate 82 communicate with each other by multiple vertical gas supply holes 83 which are arranged symmetrically with respect to the centers of the respective central gas diffusion spaces 34 and also arranged uniformly in a circumferential direction. Further, the peripheral gas diffusion space 35 (hereinafter, referred to as "lower peripheral gas diffusion space 35) of the gas distribution plate 81 and the peripheral gas diffusion space 35 (hereinafter, referred to as "upper peripheral gas diffusion space 35) of the gas distribution plate 82 communicate with each other by multiple vertical gas supply holes 84 which are arranged symmetrically with respect to the centers of the respective peripheral gas diffusion spaces 35 and also arranged uniformly in a circumferential direction. Furthermore, the outermost gas diffusion space 36 (hereinafter, referred to as "lower outermost gas diffusion space 36) of the gas distribution plate 81 and the outermost gas diffusion space 36 (hereinafter, referred to as "upper outermost gas diffusion space 36) of the gas distribution plate 82 communicate with each other by multiple vertical gas supply holes 85 which are arranged symmetrically with respect to the centers of the respective outermost gas diffusion spaces 36 and also arranged uniformly in a circumferential direction.

In the shower head 80, the processing gas and the additional gas supplied into the upper central gas diffusion space 34 is somewhat uniformly distributed in the upper central gas diffusion space 34 by free diffusion, and then, introduced into the lower central gas diffusion space 34 through the vertical gas supply holes 83 arranged uniformly in a circumferential direction. Further, the processing gas and the additional gas introduced into the lower central gas diffusion space 34 is uniformly distributed in the lower central gas diffusion space 34 by further free diffusion. The processing gas and the additional gas introduced into the upper peripheral gas diffusion space 35 is somewhat uniformly distributed in the upper peripheral gas diffusion space 35 by free diffusion, and then, introduced into the lower peripheral gas diffusion space 35 through the vertical gas supply holes 84 arranged uniformly in a circumferential direction. Further, the processing gas and the additional gas introduced into the lower peripheral gas diffusion space 35 is uniformly distributed in the lower peripheral gas diffusion space 35 by further free diffusion. The processing gas and the additional gas supplied into the upper outermost gas diffusion space 36 is somewhat uniformly distributed in the upper outermost gas diffusion space 36 by free diffusion, and then, introduced into the lower outermost gas diffusion space 36 through the vertical gas supply holes 85 arranged uniformly in a circumferential direction. Further, the processing gas and the additional gas introduced into the lower outermost gas diffusion space 36 is uniformly distributed in the lower outermost gas diffusion space 36 by further free diffusion. That is, in the shower head 80, since the free diffusion of the processing gas and the additional gas is carried out twice, the processing gas and the additional gas can be uniformly distributed in each of the gas diffusion spaces (the lower central gas diffusion space 34, the lower peripheral gas diffusion space 35, and the lower outermost gas diffusion space 36).

The application claims the benefit of priority to Japanese Patent Application No. 2012-109798 filed on May 11, 2012 and U.S. Provisional Application Ser. No. 61/648,701 filed on May 18, 2012, the disclosures of which are incorporated herein by reference.

EXPLANATION OF REFERENCE NUMERALS

S: Processing space
W: Wafer
10: Substrate processing space
11: Chamber
13, 71, 80: Shower head
28 to 31, 65, 66, 81, 82: Gas distribution plate
34: Central gas diffusion space
35: Peripheral gas diffusion space
36: Outermost gas diffusion space
39: Processing gas introducing unit
40: Additional gas introducing unit
52 to 55, 67 to 70: Gas supply path

We claim:
1. A gas supply device for supplying a gas into a processing space from a gas supply source, the gas supply device comprising:
   a facing plate that faces the processing space and includes multiple through holes;
   multiple gas distribution plates including a first gas distribution plate and a second gas distribution plate; and
   a cover plate,
   wherein the facing plate, the gas distribution plates, and the cover plate are stacked in sequence, in a surface, which faces the 'facing plate, of the gas distribution plate closest to the facing plate, multiple gas diffusion spaces are formed, in each of the gas distribution plates, at least one gas supply path through which the gas is supplied into any one of the gas diffusion spaces from the gas supply source is formed, in each of the gas distribution plates, the at least one gas supply path is branched into a first connecting line and a second connecting line at a first intersection, the first connecting line is branched into a first branch line and a second branch line at a second intersection, the second connecting line is branched into a third branch line and a fourth branch line at a third intersection, distances from the gas supply source to each front end of the first, second, third and fourth branch lines are the same, the first and second branch lines are parallel with the third and fourth branch lines, an additional gas is individually supplied into each of the gas diffusion spaces from an additional gas supply source, the multiple gas diffusion spaces include a central gas diffusion space, a peripheral gas diffusion space and an outermost gas diffusion space, the gas supply device further comprises a vertical gas supply path penetrating the multiple gas distribution plates in a thickness direction such that the vertical gas supply path is directly connected with the central gas diffusion space, each front end of the first, second, third and fourth branch lines provided within the first gas distribution plate is connected with the peripheral gas diffusion space, and each front end of the first, second, third and fourth branch lines provided within the second gas distribution plate is connected with the outermost gas diffusion space.

2. The gas supply device of claim 1, wherein conductances of the first, second, third and fourth branch lines are the same.

3. The gas supply device of claim 1, wherein the gas supply device faces a circular plate-shaped substrate via the processing space, the gas diffusion spaces include multiple groove-shaped spaces, and the groove-shaped spaces are formed to face an outer side of an outer periphery of the substrate.

4. The gas supply device of claim 3, wherein each of the gas distribution plates is formed of a circular plate-shaped member, and the gas diffusion spaces include a circular plate-shaped space formed at a central region of the circular plate-shaped member and the groove-shaped spaces formed concentrically with the circular plate-shaped space.

5. A substrate processing apparatus comprising:

a processing chamber configured to accommodate a substrate in a processing space; and a gas supply device provided to face the substrate and configured to supply a gas into the processing space from a gas supply source, wherein the gas supply device includes a facing plate that faces the processing space and includes multiple through holes; multiple gas distribution plates including a first gas distribution plate and a second gas distribution plate; and a cover plate, the facing plate, the gas distribution plates, and the cover plate are stacked in sequence, in a surface, which faces the facing plate, of the gas distribution plate closest to the facing plate, multiple gas diffusion spaces are formed, in each of the gas distribution plates, at least one gas supply path through which the gas is supplied into any one of the gas diffusion spaces from the gas supply source is formed, in each of the gas distribution plates, the at least one gas supply path is branched into a first connecting line and a second connecting line at a first intersection, the first connecting line is branched into a first branch line and a second branch line at a second intersection, the second connecting line is branched into a third branch line and a fourth branch line at a third intersection, distances from the gas supply source to each front end of the first, second, third and fourth branch lines are the same, the first and second branch lines are parallel with the third and fourth branch lines, and an additional gas is individually supplied into each of the gas diffusion spaces from an additional gas supply source, the multiple gas diffusion spaces include a central gas diffusion space, a peripheral gas diffusion space and an outermost gas diffusion space, the gas supply device further comprises a vertical gas supply path penetrating the multiple gas distribution plates in a thickness direction such that the vertical gas supply path is directly connected with the central gas diffusion space, each front end of the first, second, third and fourth branch lines provided within the first gas distribution plate is connected with the peripheral gas diffusion space, and each front end of the first, second, third and fourth branch lines provided within the second gas distribution plate is connected with the outermost gas diffusion space.

* * * * *